(12) United States Patent
Morita et al.

(10) Patent No.: US 7,237,173 B2
(45) Date of Patent: Jun. 26, 2007

(54) RECORDING AND REPRODUCING APPARATUS, SIGNAL DECODING CIRCUIT, ERROR CORRECTION METHOD AND ITERATIVE DECODER

(75) Inventors: Toshihiko Morita, Kawasaki (JP); Yuichi Sato, Kawasaki (JP); Takao Sugawara, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 593 days.

(21) Appl. No.: 10/161,228

(22) Filed: Jun. 3, 2002

(65) Prior Publication Data

US 2003/0066020 A1    Apr. 3, 2003

(30) Foreign Application Priority Data

Jun. 11, 2001 (JP) ............................. 2001-176222
Sep. 10, 2001 (JP) ............................. 2001-273141

(51) Int. Cl.
*H03M 13/00* (2006.01)
*H03M 13/03* (2006.01)
*H03D 1/00* (2006.01)

(52) U.S. Cl. ..................... 714/755; 714/795; 375/341

(58) Field of Classification Search ............... 714/780, 714/755, 765, 746, 795, 769; 375/341; 360/25
See application file for complete search history.

(56) References Cited

U.S. PATENT DOCUMENTS

| 4,653,052 A | * | 3/1987 | Doi et al. .................... 714/755 |
| 4,852,099 A |   | 7/1989 | Ozaki |
| 5,222,069 A | * | 6/1993 | Chevalley .................... 714/765 |
| 5,233,482 A | * | 8/1993 | Galbraith et al. ............. 360/46 |
| 5,446,747 A |   | 8/1995 | Berrou |
| 5,701,314 A |   | 12/1997 | Armstrong et al. |
| 5,714,262 A |   | 2/1998 | Stouffer et al. |

(Continued)

FOREIGN PATENT DOCUMENTS

EP    0783168 A2    7/1997

(Continued)

OTHER PUBLICATIONS

Iterative Decoding for Digital Recording Systems: Jan Bajcsy, James A. Hunziker and Hisashi Kobayashi; Department of Electrical Engineering; Princeton University; IEEE Global Telecommunications Conference, New York, NY vol. 5, 1998; pp. 2700-2705.

(Continued)

*Primary Examiner*—Phung My Chung
(74) *Attorney, Agent, or Firm*—Greer, Burns & Crain, Ltd

(57) ABSTRACT

A recording and reproducing apparatus having an ECC-less error correction function, includes an erasure detector generating an erasure flag indicating erasure of a read signal; and an iterative decoder having two soft-in/soft-out (SISO) decoders, i.e., an inner decoder and an outer decoder, and correcting the erasure by inputting the erasure flag $e_k$ into the inner decoder and performing erasure compensation in the inner decoder. As the erasure compensation in the inner decoder, channel information is masked while the erasure flag is on. The erasure of data due to a media defect is detected inside the iterative decoder, and the second erasure flag is inputted into the inner decoder to perform erasure compensation in the inner decoder.

30 Claims, 20 Drawing Sheets

U.S. PATENT DOCUMENTS

| | | | |
|---|---|---|---|
| 5,844,920 A * | 12/1998 | Zook et al. | 714/769 |
| 5,875,199 A | 2/1999 | Luthi | |
| 6,029,266 A | 2/2000 | Lee | |
| 6,226,136 B1 | 5/2001 | Cheru | |
| 6,405,342 B1 * | 6/2002 | Lee | 714/792 |
| 6,604,220 B1 * | 8/2003 | Lee | 714/769 |
| 6,615,385 B1 * | 9/2003 | Kim et al. | 714/758 |
| 6,629,287 B1 * | 9/2003 | Brink | 714/755 |
| 6,757,117 B1 * | 6/2004 | Livingston | 360/25 |

FOREIGN PATENT DOCUMENTS

EP    0783168 A3    2/1999

OTHER PUBLICATIONS

On Reverse Concatenation and Soft Decoding Algorithms for PRML Magnetic Recording Channels; IEEE Journal on Selected Areas in Communications; vol. 19, No. 4; Apr. 2001; pp. 612-618.

* cited by examiner

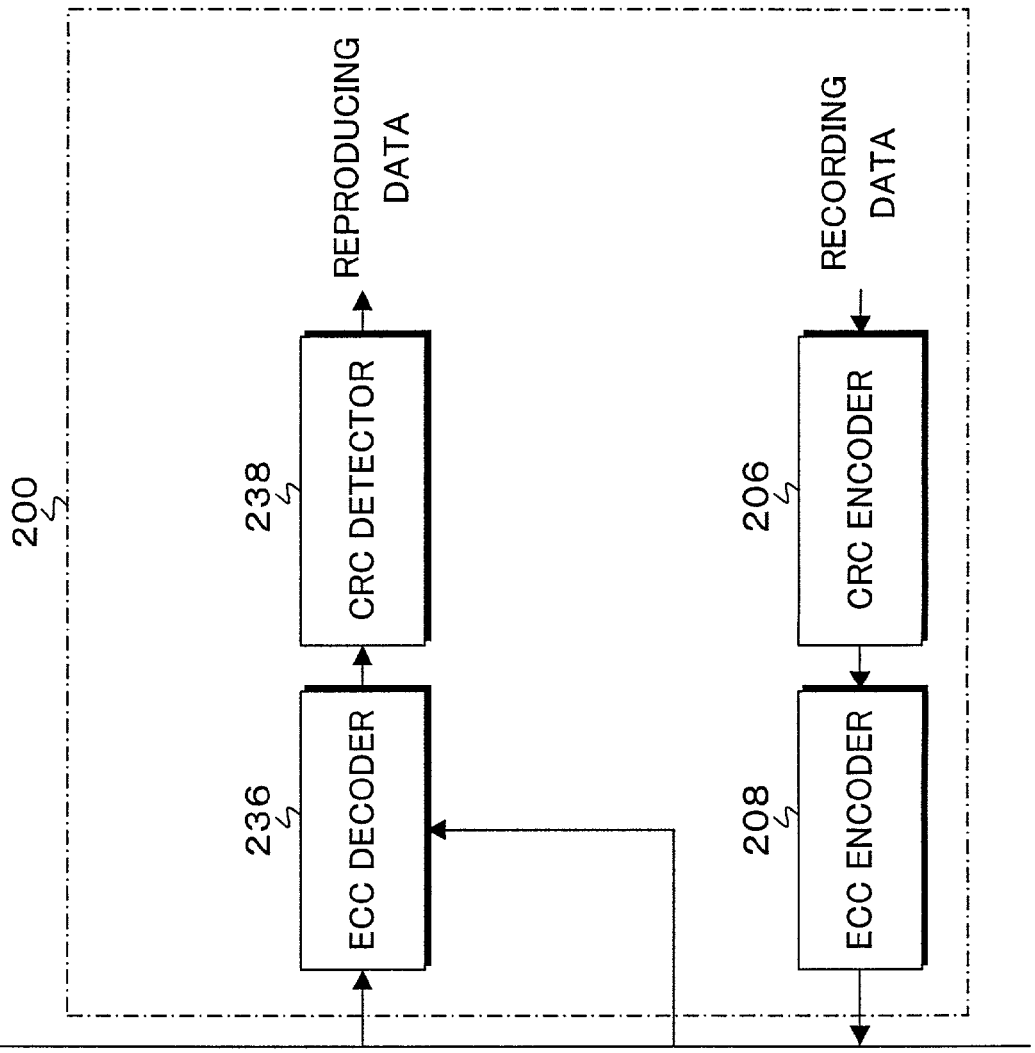

RECORDING AND REPRODUCING APPARATUS, SIGNAL DECODING CIRCUIT, ERROR CORRECTION METHOD AND ITERATIVE DECODER

BACKGROUND OF THE INVENTION

1. Field of the Invention

The present invention relates to a recording and reproducing apparatus, a signal decoding circuit, an error correction method and an iterative decoder for reproducing a signal from a magnetic disk, an optical disk, a magneto-optical disk or the like and for decoding a signal in a communication equipment. The present invention particularly relates to a recording and reproducing apparatus, a signal decoding circuit, an error correction method and an iterative decoder having an error correction function based on an iterative decoding method.

2. Description of the Related Art

A recording and reproducing apparatus has had hitherto a strong error correction function to reproduce a recorded signal without any error. It is impossible to ensure decoding a recorded signal from instable signals including noise until the apparatus employs this error correction function. Recently, the error correction of a recording and reproducing apparatus is mainly realized by a combination of two systems referred to as "PRML (Partial Response Maximum Likelihood" and "ECC (Error Correcting Code). The PRML (Partial Response Maximum Likelihood) is a system for regarding a recording channel as a partial response channel (PR channel) having an interference between codes and performing an maximum likelihood detection normally employing a Viterbi detector. The ECC (Error Correcting Code) is a system for correcting an error which cannot be corrected by the Viterbi detector. Normally, a Reed-Solomon code is employed as the ECC. General description relating to the Viterbi detector and Reed-Solomon code is given in many documents exemplified by "S. Lin and D. J. Costello, Jr., Error control coding: fundamentals and applications, Prentice-Hall, 1983".

FIG. 1 is a block diagram of a magnetic disk drive which is a typical example of a recording and reproducing apparatus. The drive is comprised of a hard disk controller (HDC) 200, a read channel (RDC) 202 and ahead IC 204. First, parity is added to recording data by a CRC encoder 206 and an ECC encoder 208 in the HDC 200. CRC (Cyclic Redundancy Check) codes are employed to detect the erroneous correction of the ECC. Next, the RDC 202 transmits the recording data to a driver 216 in the head IC 204 by way of an encoder 210, a write precompensator 212 and a driver 214. The encoder 210 employs RLL codes or the like for stabilizing the timing recovery system. Also, the write precompensator 212 performs a compensation processing for slightly widening a distance of magnetic transitions. Finally, the driver 216 of the head IC 204 generates a write current to be applied to the write head. On the other hand, an analog signal from a read head is amplified by a preamplifier 218 in the head IC 204 and then transmitted to an RDC 202. In the PRC 202, the analog signal is converted into a digital signal by way of a thermal asperity detector 220, a variable gain amplifier (VGA) 222, a low-pass filter (LPF) 224 and an analog-to-digital converter (ADC) 226. Then, an FIR filter 228 equalizes the waveform of the digital signal and a decoder 230 conducts Viterbi decoding to the resultant digital signal. It is noted that the RDC 202 has a PLL 232 controlling timing for sampling a signal and an automatic gain controller (AGC) 234 controlling the gain of the variable gain amplifier 222. A decoding result obtained by the RDC 202 is returned to the HDC 200. In the HDC 200, an ECC decoder 236 corrects the errors of the resultant signal, a CRC decoder 238 performs a check processing for the signal and the signal turns into reproducing data.

A magnetic disk apparatus of these days employs an MR (Magneto-resistive) head as a read head. Since the MR head flies from the surface of a disk medium only by 30 to 50 nm, the head is often contacted with or collided against protrusions or the like of the disk surface.

When contact or collision occurs, a resistance value increases as the temperature of the head rises. Due to this, as shown in FIG. 2A, the direct-current level of a reproducing signal E1 greatly changes. This phenomenon is referred to as a thermal asperity phenomenon or TA phenomenon. When the TA phenomenon occurs, a signal having a high amplitude is inputted into the apparatus and an AGC circuit and a PLL circuit which have stably operated so far are adversely influenced by the signal. To prevent this, the TA phenomenon is normally detected based on a fixed threshold value ±Th and, as shown in FIG. 2B, a detection signal E2 which is turned on only when the signal E1 exceeds the threshold value is generated as an erasure flag. While the erasure flag is turned on, the operations of the PLL circuit 232 and the AGC 234 are fixed. As a result, as shown in FIG. 2C, the read signal turns into a signal E3 having a range between the threshold value ±Th. Also, to minimize the influence of the TA phenomenon, there were proposed methods for providing TA detection circuit 220 with the characteristic of a high-pass filter (HPF) (as disclosed in the drawings of the specifications of U.S. Pat. Nos. 5,233,482 and 6,226,136). In these cases, as shown in FIGS. 3A to 3C, it is possible to return the output of the head to an original level faster. Since an original read signal cannot be observed while the TA phenomenon occurs, i.e., the erasure flag is turned on, this period can be regarded as a state in which input data disappears. The Viterbi decoder cannot restore the data which has disappeared for a long time. For that reason, the correction of such data disappearance has conventionally relied on the ECC. The ECC can correct lost data of a certain length. Besides, as shown in FIG. 1, by referring to the erasure flag, it is possible to improve an error correction capability of the ECC. However, as the speed of rotation of a disk spindle motor increases, a TA length increases. Even if the HPF is employed in the TA detector 220, the TA length becomes as large as several tens of bytes. According to the increased TA length, the parity length of the ECC inevitably increases, thereby disadvantageously decreasing the recording capacity of the apparatus. In this connection, methods for inputting an erasure flag into an ECC and correcting erased data are disclosed in the drawings of the specifications of U.S. Pat. Nos. 5,701,314, 5,875,199 and the like. In addition, various modifications for the erasure correction by the ECC are disclosed in, for example, the drawings of the specifications of U.S. Pat. Nos. 5,714,262, 4,852,099 and the like. Erasure phenomena such as the TA phenomenon are not limited to a magnetic disk. Similar phenomenon occurs even to a magneto-optical disk, for example, due to a medium defect, a flaw, a dust or the like. To prevent this, therefore, the magneto-optical disk detects data erasure based on a threshold processing and performs a processing for fixing the operations of an AGC and a PLL as in the case of the magnetic disk. Likewise, an ECC performs an erasure correction.

In addition to the TA phenomenon, there is a media defect which causes a read signal to disappear. FIG. 4 shows an example of a reproducing signal if a defect of a signal attenuation factor of 50% occurs. An interval indicated by an arrow is a defect interval 260. As can be seen from FIG. 4, the signal attenuates. It is difficult to detect such a defect by a simple threshold processing. Normally, long defects are extracted by a prior check and then a defective part is replaced by a normal sector. Nevertheless, short defects are not replaced. In addition, there are cases where a new defect occurs with the passage of time. It is, therefore, required to employ a decoding method robust to such defects.

Recently, as new encoding and decoding systems replacing the PRML system, there have been proposed a Turbo code, a low density parity check code or LDPC and the like. Since these systems perform decoding by iterative calculation, they will be generally referred to as "iterative decoding method". A Turbo code disclosed in the drawings of the specification of U.S. Pat. No. 5,446,747 is typical of the iterative decoding method. The Turbo code is a parallel concatenation code in which two recursive systematic convolutional codes or RSC codes are connected to each other through a random interleaver. The Turbo code performs decoding by iterative calculation employing two Soft-In/Soft-Out decoders. While the Turbo code was devised in the field of communications, a plurality of systems for applying the Turbo code to a PR channel in a recording and reproducing systems are disclosed in a document, "T. Souvignier et al., "Turbo Decoding for PR4: Parallel Versus Serial Concatenation," Proc. IEEE Int. Conf. on Communications, pp. 1638–1642, 1999".

If the Turbo code is applied to the PR channel, a configuration in which two constituent encoders 240 and 244 are serially concatenated through a random interleaver 242 denoted by π as shown in FIG. 5A is used. Here, the constituent encoder 244 closer to the channel is referred to as an inner encoder and the other constituent encoder 240 is referred to as an outer encoder. Actually, in case of the PR channel, the channel can be regarded as a convolutional encoder, so that there is no need to provide the inner encoder 244. However, to provide a recursive systematic convolutional code, an auxiliary encoder referred to as a precoder is sometimes employed. As the outer encoder 240, on the other hand, various types of encoders employing two recursive systematic convolutional codes (RSC's) and employing one recursive systematic convolutional code (RSC) have been proposed. Further, there are cases where low density parity check codes (LDPC's) disclosed by a document, "R. G. Galleger, Low-Density Parity-Check Codes, Cambridge, Mass.: MIT Press, 1963" and a Turbo product codes (TPC's) disclosed by a document, "R. M. Pyndiah,"Near-optimum decoding of product codes: block turbo codes, "IEEE Trans. on Communications, 46–8, pp. 1003–1010, 1998" are employed. An iterative decoder is constituted out of two constituent decoders referred to as an inner decoder 246 and an outer decoder 250 as shown in FIG. 5B. The inner decoder 246 performs decoding corresponding to encoding of the inner encoder 244 shown in FIG. 5A and the outer decoder 250 performs decoding corresponding to the encoding of the outer encoder 240 shown in FIG. 5A. The inner decoder is sometimes referred to as a channel decoder. The iterative decoding method is characterized by performing MAP or Maximum a posteriori Probability decoding. Due to this, both of the two constituent decoders are SISO or Soft-In/Soft-Out decoders. The SISO decoder does not simply output a hard decision such as 0 or 1 but outputs reliability information such as 0.4 or 0.9.

The inner decoder 246, for example, calculates the a posteriori probability of an information symbol $x_k$ given a read signal sequence $y_k$ (k=1 to N). The a posteriori probability is expressed by the log-likelihood ratio of the probability as follows:

$$\Lambda(x_k) = ln \frac{P(x_k = 1 | y_1^N)}{P(x_k = 0 | y_1^N)}. \tag{1}$$

In the equation (1), $y_1^N = \{y_1, y_2, \ldots y_N\}$. On the other hand, the a priori information $\Lambda a(x_k)$ obtained prior to decoding is inputted, in the form of the log-likelihood ratio, into the inner decoder 246. The inner decoder 246 calculates the a posteriori probability expressed by the formula (1) from this a priori information $\Lambda a(x_k)$ and the read signal $y_k$. Also, the inner decoder 246 outputs extrinsic information by subtracting the a priori information from the a posteriori probability as expressed by equation (2) as follows:

$$\Lambda_e(x_k) = \Lambda(x_k) - \Lambda_a(x_k) \tag{2}.$$

This extrinsic information $\Lambda e(x_k)$ is transferred to the other encoder. Decoding procedures will be described again with reference to FIG. 5B. The read signal $y_k$ is inputted first into the inner decoder 246. The inner decoder 246 calculates and outputs extrinsic information $\Lambda e(x_k)$ from the read signal series $y_k$ and the a prior information $\Lambda a(x_k)$ outputted from the outer decoder 250. The extrinsic information $\Lambda e(x_k)$ is turned into the a priori information $\Lambda a(x'_k)$ on the outer decoder 250 by way of a deinterleaver 248 denoted by $\pi^{-1}$. The outer decoder 250 outputs the a posteriori probability $\Lambda(u_k)$ and extrinsic information $\Lambda e(x'_k)$ of the information sequence. The extrinsic information $\Lambda e(x'_k)$ is employed again as a priori information $\Lambda a(x_k)$ of the inner decoder 246 by way of the interleaver 252 denoted by π. After iterating the processings a predetermined number of times, the a posteriori probability $\Lambda(u_k)$ outputted from the outer decoder 250 is subjected to a threshold processing by a comparator 254, thereby finishing decoding. As a concrete calculation method for Soft-In/Soft-Out (SISO) decoding with respect to codes such as convolutional codes defined by state transition, there is known a BCJR algorithm. Normally, both the inner decoder and the outer decoder employ the BCJR algorithm. If LDPC codes are employed as the outer encoder, the outer decoder is based on a belief propagation algorithm. The BCJR algorithm is described in detail in a document, "L. R. Bahl et al., "Optimal decoding of linear codes for minimizing symbol error rate," IEEE Trans. Inform. Theory, vol. 20, pp. 248–87, 1974". Also, the general description of the iterative decoding method is given in a document, "Z. Wu, Coding and iterative detection for magnetic recording channels, Kluwer Academic Publishers, 2000". The iterative decoding method stated above has a higher error correction capability than that of the PRML decoding method and is expected to become a promising coding method in the next generation.

While exhibiting a far higher error correction capability than that of the conventional PRML decoding method, the above-stated iterative decoding method is disadvantageously low in ECC effect. This is because almost all errors are corrected by iterative decoding, there is hardly left errors which the ECC could correct. Actually, with the iterative decoding method, SN improvement by adding the ECC is as low as not more than 0.5 dB. Due to this, while the iterative decoding method has higher SN improvement than that of the conventional PRML decoding method before the addition of the ECC, there is little difference between the iterative decoding method and the PRML decoding method in SN improvement after the addition of the ECC. If the effect of ECC is low, the error correction capability of the iterative decoding method is not deteriorated by eliminating the ECC. Rather, by eliminating the ECC, a loss generated as a result of adding the ECC is removed and a required S/N ratio is advantageously improved accordingly. However, if the ECC is eliminated, the iterative decoding method cannot correct long erasure derived from the TA phenomenon or the like. As a result, even if only low S/N improvement is normally expected, it is necessary to combine the iterative decoding method with the ECC so as to correct the erasure derived from the TA phenomenon or the like.

SUMMARY OF THE INVENTION

According to the present invention, there are provided a recording and reproducing apparatus, a signal decoding circuit, an error correction method and an iterative decoder based on an ECC-less configuration by correcting erased data in the iterative decoder.

The present invention provides a recording and reproducing apparatus having an error correction function based on an ECC-less configuration, is characterized by including: an erasure detector (first erasure detector) generating an erasure flag (first erasure flag) indicating erasure of a read signal; and an iterative decoder 82 having two soft-in/soft-out (SISO) decoders, i.e., an inner decoder and an outer decoder, the iterative decoder correcting the erasure of the read signal by inputting the erasure flag $e_k$ into the inner decoder and performing erasure compensation in the inner decoder. Here, as the erasure compensation in the inner decoder, channel information is masked while the erasure flag is on. As can be seen, according to the present invention, since the EGG is unnecessary, it is possible to increase the recording capacity of the apparatus by as much as the parity of the ECC or to increase the number of parities to be added by the iterative decoding method to thereby further improve the error correction capability.

The erasure detector detects thermal asperity (TA) and generates the erasure flag indicating the erasure of the read signal. The inner decoder is the soft-in/soft-out decoder based on a BCJR (Bahl-Cocke-Jeinek-Raviv) decoding method; and if the erasure flag $e_k$ is on, channel information $\Lambda c(y_k)$ may be masked with 0 in the inner decoder. The inner decoder is the soft-in/soft-out decoder based on a BCJR (Bahl-Cocke-Jeinek-Raviv) decoding method; and if the erasure flag is on, an exponential value of channel information may be masked with 1 in the inner decoder. The inner decoder is the soft-in/soft-out decoder based on a logarithm maximum a posteriori probability (LogMAP) decoding method; and if the erasure flag is on, channel information is masked with 0 in the inner decoder. The inner decoder is the soft-in/soft-out decoder based on an approximation type logarithm maximum a posteriori probability (MaxLogMAP) decoding method; and if the erasure flag is on, channel information may be masked with 0 in the inner decoder. The inner decoder is the soft-in/soft-out decoder based on a soft output Viterbi algorithm (SOVA) decoding method; and if the erasure flag is on, channel information may be masked with 0 in the inner decoder. The erasure detector expands forward a leading edge of the erasure flag by a predetermined number of bits. Also, the erasure detector expands backward a trailing edge of the erasure flag by a predetermined number of bits. By doing so, the influence of the change of the DC component of the read signal on the rising edge or the falling edge of the erasure flag is decreased.

According to the present invention, the iterative decoder compensates for the disappearance of the read signal derived from a media defect. Due to this, the recording and reproducing apparatus according to the present invention is characterized in that a second erasure detector generating a second erasure flag indicating the disappearance of the read signal is provided in the iterative decoder; and that a logical sum of the first erasure flag and the second erasure flag by the second erasure detector is inputted into the inner decoder. Here, the second erasure detector generates the second erasure flag by checking violation of an RLL constraint. Also, the second erasure detector generates the second erasure flag only if a number of times of the violation of the RLL constraint is equal to or higher than a predetermined number. As can be seen, by constituting the iterative decoder so that the second erasure detector is provided in the iterative decoder and that the erasure flag is generated by detecting a defect, it is possible to apply an erasure compensation processing even to the defect and to realize a recording and reproducing apparatus based on an ECC-less configuration.

The present invention provides a signal decoding circuit characterized by including: a erasure detector generating an erasure flag indicating disappearance of a read signal; and an iterative decoder having two soft-in/soft-out decoders; i.e., an inner decoder and an outer decoder, the iterative decoder correcting the erasure of the read signal by inputting the erasure flag into the inner decoder and performing erasure compensation in the inner decoder. The detail of this signal decoding circuit is the same as that of the recording and reproducing apparatus.

The present invention provides an error correction using an ECC-less method for decoding a read signal by an iterative decoder including two soft-in/soft-out decoders; i.e., an inner decoder and an outer decoder, characterized by including the steps of: generating an erasure flag indicating disappearance of the read data; and inputting the erasure flag into the inner decoder, performing erasure compensation in the inner decoder, and thereby correcting the erasure. The detail of this error correction method is the same as the configuration of the apparatus.

Also, the present invention provides a read channel having an ECC-less, error correction function characterized by including: an erasure detector generating an erasure flag indicating disappearance of a read signal; and an iterative decoder having two soft-in/soft-out decoders; i.e., an inner decoder and an outer decoder, the iterative decoder correcting the disappearance of the read signal by inputting the erasure flag into the inner decoder and performing erasure compensation in the inner decoder.

Furthermore, the present invention provides an iterative decoder characterized by including two soft-in/soft-out decoders; i.e., an inner decoder and an outer decoder, inputting an external erasure flag indicating disappearance of a read signal into the inner decoder, performing erasure compensation in the inner decoder, and thereby correcting lost data. The details of the read channel and the iterative decoder are the same as that of the recording and reproducing apparatus.

The above and other objects, features, and advantages of the present invention will become more apparent from the following detailed description with reference to the drawings.

BRIEF DESCRIPTION OF THE DRAWINGS

FIGS. 1A and 1B are block diagrams of a conventional recording and reproducing system to which a PRML method is applied, respectively;

DETAILED DESCRIPTION OF THE PREFERRED EMBODIMENTS

Figure 6:
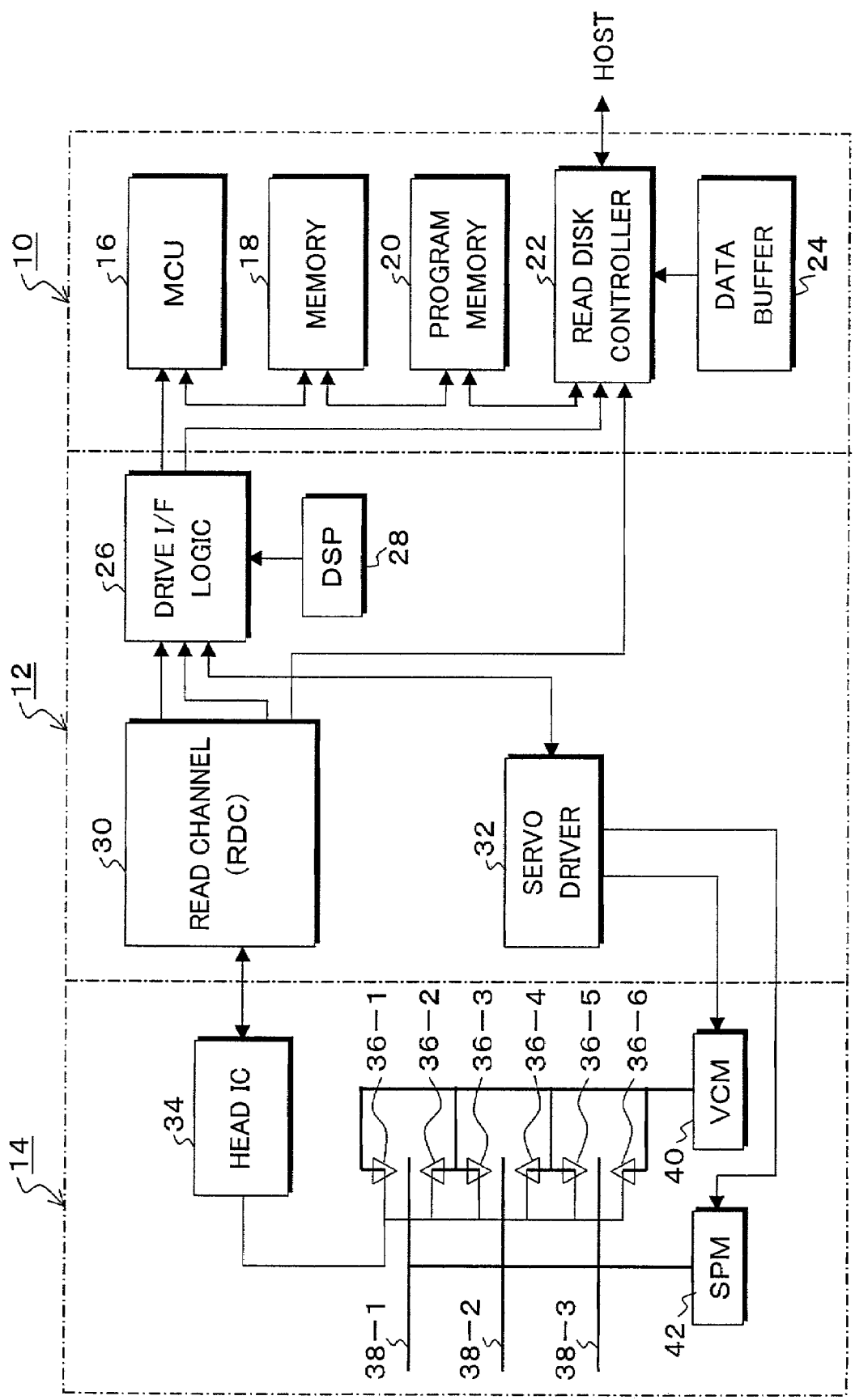
FIG. 6 is a block diagram of a hard disk drive to which the present invention is applied.

FIG. 6 is a block diagram of a hard disk drive to which the present invention is applied. The hard disk drive is constituted out of an SCSI controller 10, a drive control 12 and a disk enclosure 14. Needless to say, the interface between the disk drive and a host is not limited to the SCSI controller 10 and an appropriate interface controller is applicable. The SCSI controller 10 is provided with an MCU (main control unit) 16, a memory 18 employing a DRAM or SRAM as a control memory, a program memory 20 employing a non-volatile memory such as a flash memory storing a control program, a hard disk controller (HDC) 22 and a data buffer 24. The hard disk controller 22 of the SCSI controller 10 is normally provided with a formatter and an ECC processing section. Since the present invention can dispense with an ECC, the hard disk controller 22 is not provided with ECC-related sections.

Figure 7A:
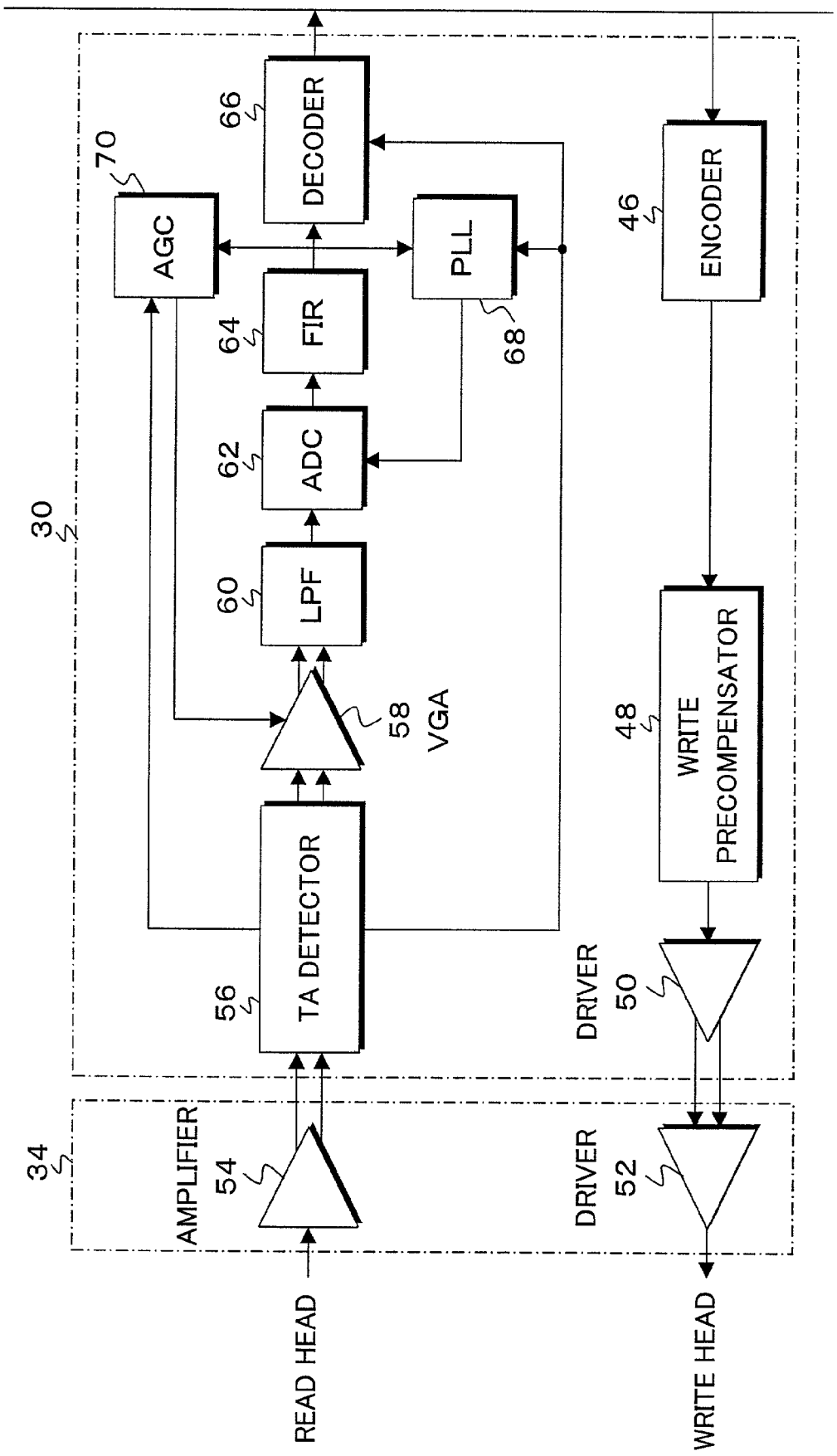
FIGS. 7A and 7B are block diagrams of a recording and reproducing system of the hard disk drive shown in FIG. 6 which does not require an ECC.
Figure 7B:
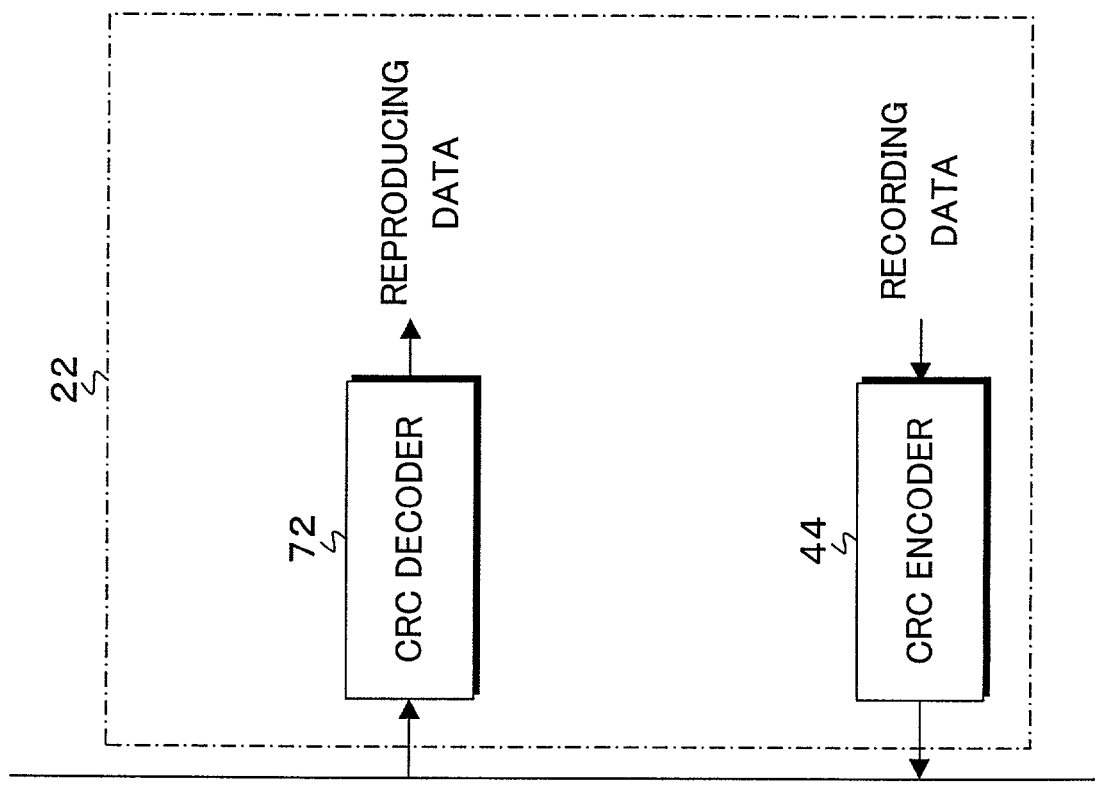

FIGS. 7A and 7B show the configuration of a recording and reproducing system according to the present invention in the hard disk drive shown in FIG. 6. The recording and reproducing system of a magnetic disk apparatus consist of a hard disk controller (HDC) 22, a read channel (RDC) 30 and a head IC 34. First, in the HDC 22, parity is added to recording data by a CRC encoder 208. According to the present invention, since the ECC is not necessary, no ECC encoder is provided. Next, in the RDC 30, the recording data is passed through an iterative encoder 46, a write precompensator 48 and a driver 50 and transmitted to the driver 52 of the head IC 34. The encoder 46 employs RLL codes or the like to stabilize clock recovery performed by a PLL. Also, the write precompensator 48 performs a compensation processing for slightly increasing a distance of magnetic transitions. Finally, in the head IC 34, the driver 52 generates a write current to be applied to a recording head to allow the recording data to be recorded on a magnetic disk. On the other hand, during reproducing, first, a preamplifier 43 in the head IC 34 amplifies an analog voltage applied from an MR head and then feeds the amplified analog voltage to the RDC 30. In the RDC 30, a thermal asperity detecting section 56 performs a detection processing and then the analog voltage is converted into a digital signal by way of a variable gain amplifier (VGA) 58, a low-pass filter (LPF) 60 and an AD converter (ADC) 62. Next, an FIR filter 64 performs a waveform equalization processing or the like and then a decoder 66 based on an iterative decoding method performs iterative decoding. In the RDC 30, a PLL 68 which controls timing for sampling a signal and an automatic gain controller (AGC) 70 which controls the gain of the variable gain amplifier 58 are also provided. A decoding result of the RDC 30 is returned to the HDC 22, subjected to a check processing by a CRC decoder 72, and decoded to reproducing data. Further, since the present invention does not require the ECC, the HDC 22 is not provided with an ECC decoder. Besides, according to the present invention, an erasure flag outputted from the TA detector 56 is inputted into the decoder 66 and the decoder 66 corrects data which disappeared. Due to this, it is possible to realize the ECC-less configuration. The recording data is transmitted to the encoder 46 in the RDC only by way of the CRC encoder 44 and the output of the decoder 66 is directly transmitted to the CRC decoder 72.

Figure 1A:
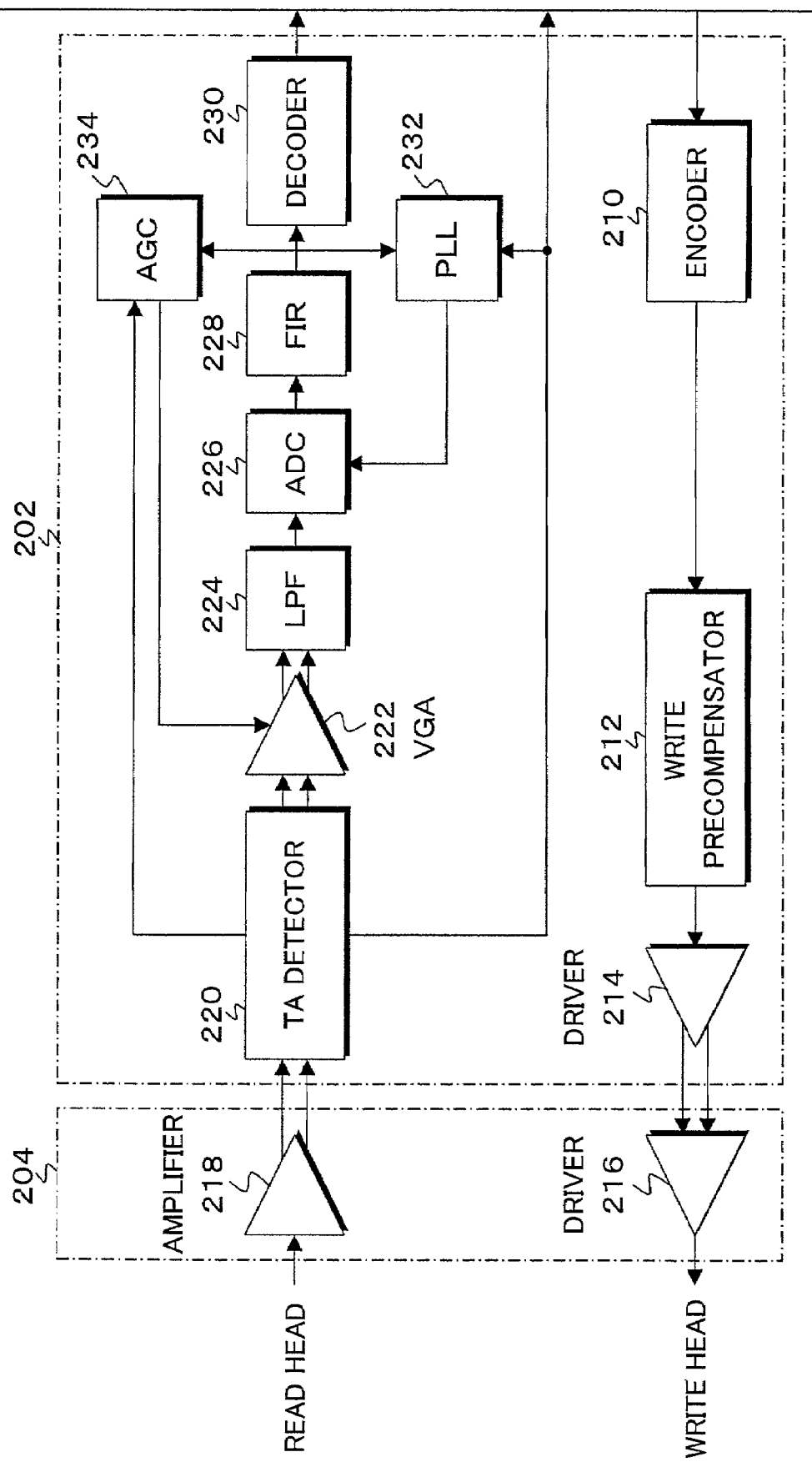
Figures 2A, 2B, 2C:
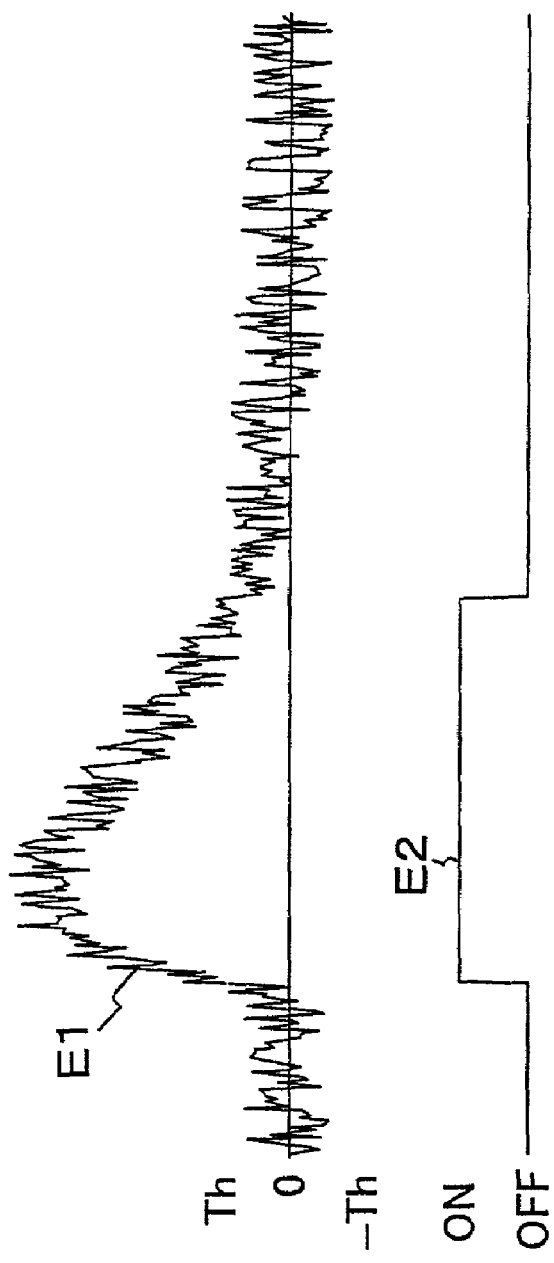
FIGS. 2A to 2C are time charts of a head output signal when a TA phenomenon occurs, an erasure flag by the detection of the TA phenomenon, and an amplifier output signal after a threshold processing is performed.
Figure 3A:
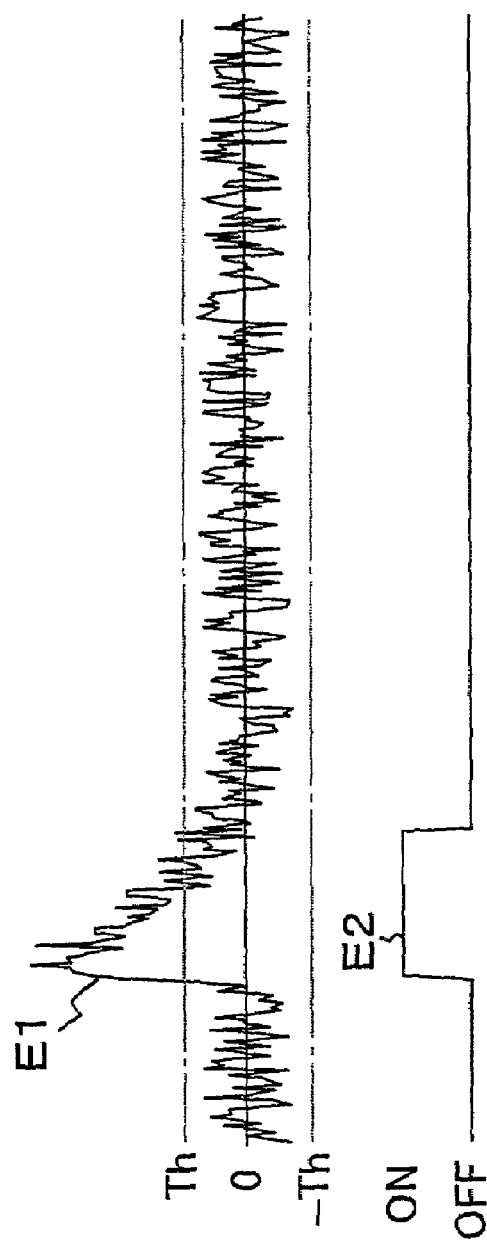
FIGS. 3A to 3C are time charts of a head output signal when a high-pass filter suppresses a variation when a TA phenomenon occurs, an erasure flag by the detection of the TA phenomenon and an amplifier output signal after a threshold processing is performed.
Figure 3B:
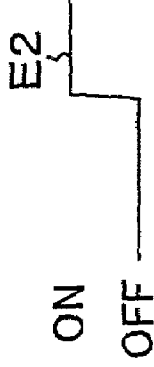
Figure 3C:
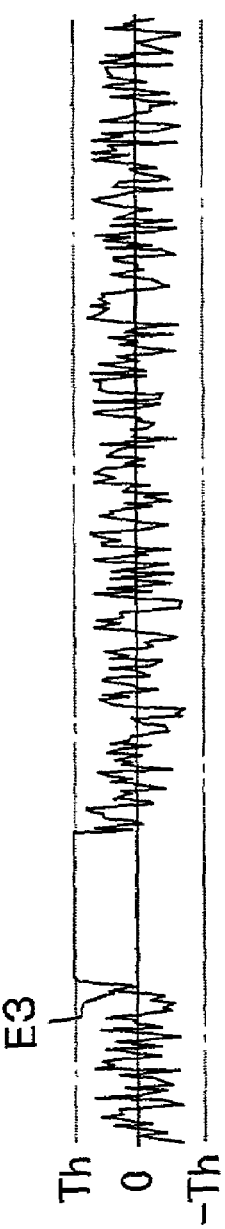
Figure 4:
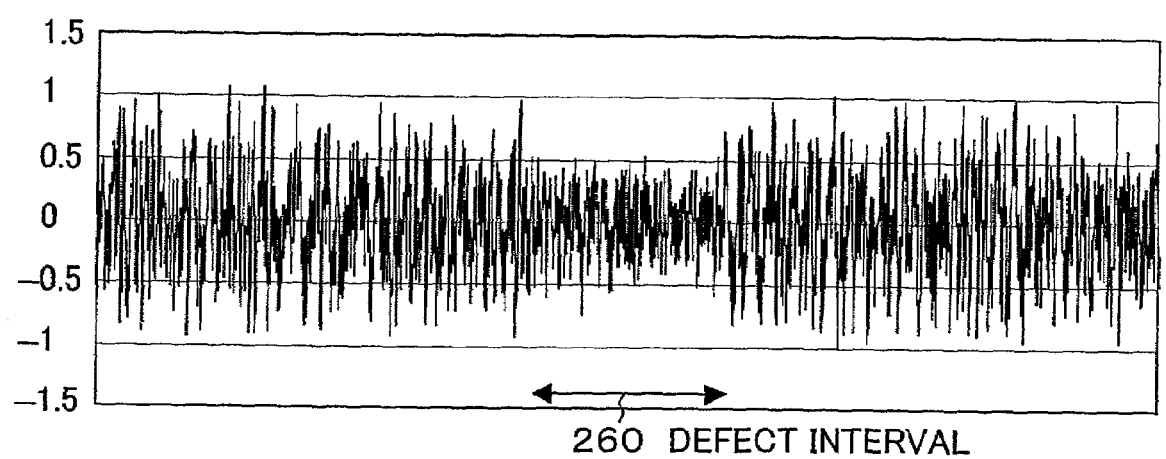
FIG. 4 is an explanatory view for the read-back waveform of a magnetic disk apparatus when a defect occurs.
Figure 5A:
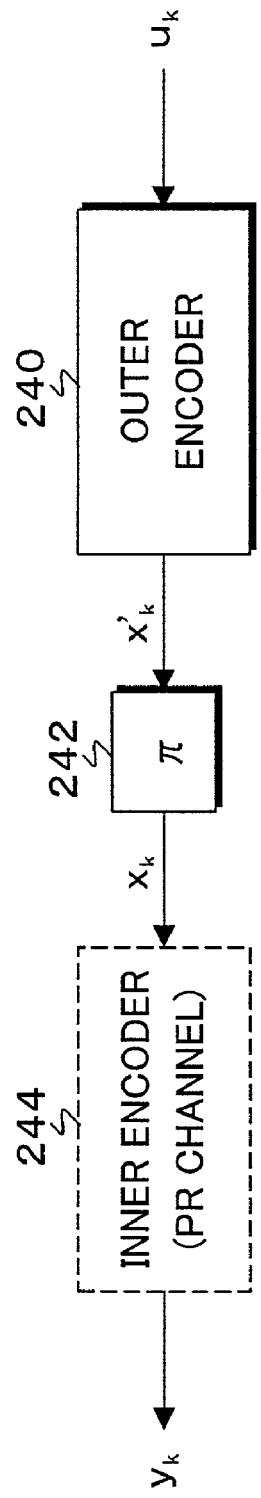
FIGS. 5A and 5B are block diagrams showing the basic configurations of a conventional encoder and a conventional decoder employed for an iterative decoding method requiring an ECC.
Figure 8A:
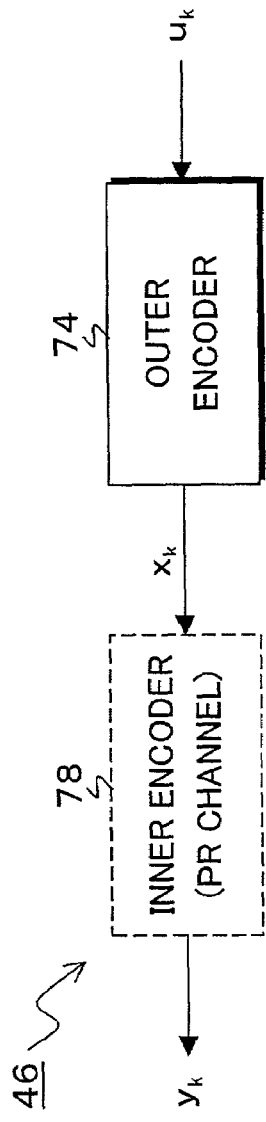
FIGS. 8A and 8B are block diagrams showing the basic configurations of an encoder and a decoder according to the present invention applied to iterative decoding shown in FIGS. 7A and 7B.
Figure 8B:
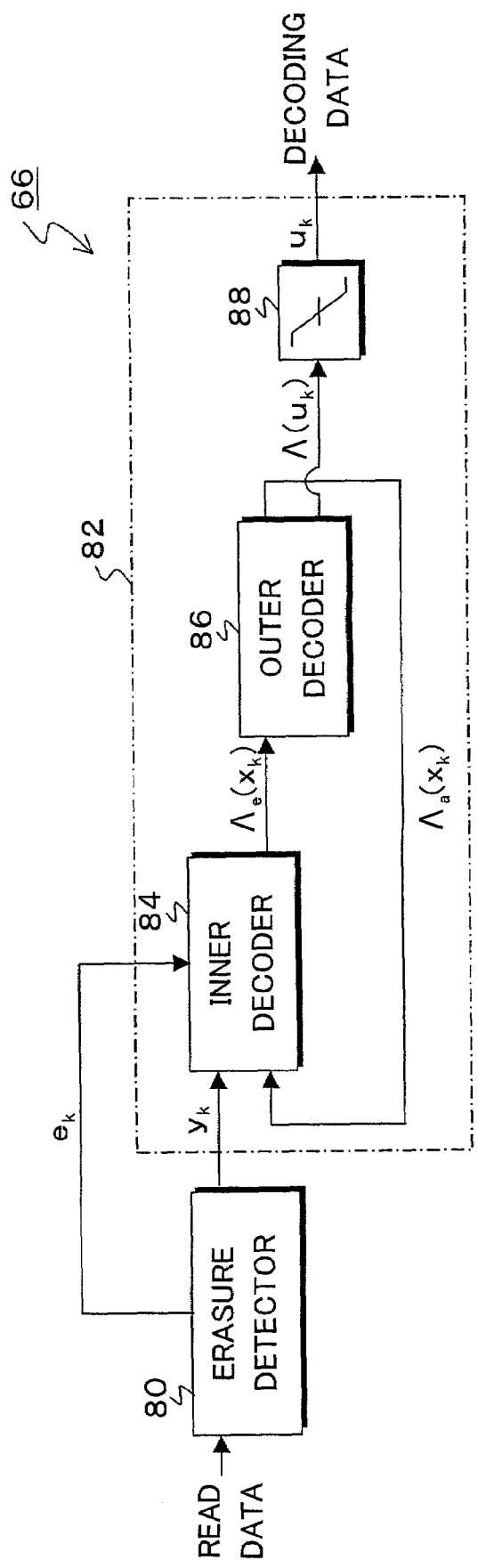

FIG. 8A shows the basic configuration of an encoder according to the present invention. FIG. 8B shows the basic configuration of a decoder according to the present invention. In FIG. 8A, the encoder 46 is constituted so that an outer encoder 74 and an inner encoder 78 are serially concatenated. Here, since a PR channel can be regarded as a convolutional encoder per se, there is no need to provide the inner encoder 78. The encoder 46 is basically the same as the encoder shown in FIG. 5A except that recording data does not include an ECC. The decoder 66 according to the present invention as shown in FIG. 8B is constituted out of an erasure detector 80 and an iterative decoder 82. The erasure detector 80 detects data erasure derived from a TA phenomenon or the like and outputs an erasure flag signal indicating the location of a bit which disappeared. The iterative decoder 82 consists of two Soft-In/Soft-Out (SISO) decoders, i.e., an inner decoder 84 and an outer decoder 86. The inner decoder 84 receives the erasure flag signal E10 and performs a decoding calculation while masking channel information corresponding to the lost bit. After the inner decoder 84 and the outer decoder 86 perform iterative decoding a predetermined number of times, a comparator 88 performs a threshold processing and generates and outputs decoding data. In this example, the erasure detector 80 is arranged outside of the iterative decoder 82. Alternatively, the erasure detector 80 may be arranged in the iterative decoder 82. Also, there are cases where no threshold processing is performed by the comparator 88. Furthermore, the configuration of the iterative decoder 82 shown in FIGS. 8A and 8B include only the important parts thereof. Actually, modules other than those shown therein are provided among the constituent elements shown. For example, a random interleaver is often inserted between the inner decoder 84 and the outer decoder 86.

Figure 5B:
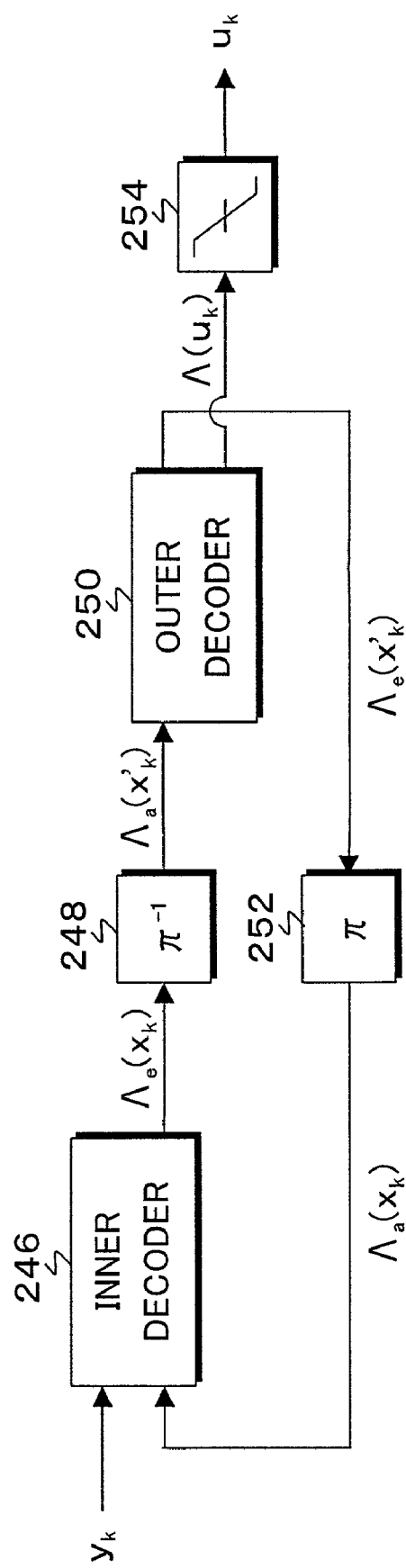

Now, description will be given to the concrete processing of the inner decoder 84 according to the present invention for masking channel information for correcting data erasure. First, BCJR decoding procedures executed by the inner decoder 84 will be described in detail. Similarly to FIG. 5B already shown and described, the inner decoder 84 calculates extrinsic information $\Lambda e(x_k)$ using a read signal sequence $y_k$ from the channel and a prior information $\Lambda a(x_k)$ from the outer decoder 86. Consider here a trellis expressing the state transition of codes. Channel information $\Lambda c(y_k)$ is obtained from the read signal $y_k$ and an ideal signal $m_k$ associated with a certain state transition based on the following formula:

$$\Lambda_c(y_k) = -\frac{1}{2\sigma^2}(y_k - m_k)^2, \quad (3)$$

where $\sigma^2$ is a noise variance. Next, a branch metric for the state transition $S_{k-1} \to S_k$ is obtained as follows:

$$y_k(S_{k-1}, S_k) = \exp\{x_k \Lambda_a(x_k)\} \exp\{\Lambda_c(y_k)\} \quad (9)$$

Further, $\alpha_k(S_k)$ is obtained by a recursive calculation in forward direction as follows:

$$\alpha_k(S_k) = \sum_{S_{k-1}} \alpha_{k-1}(S_{k-1}) \gamma_k(S_{k-1}, S_k). \quad (5)$$

$\beta_{k-1}(S_{k-1})$ is obtained by a recursive calculation in backward direction as follows:

$$\beta_{k-1}(S_{k-1}) = \sum_{S_k} \beta_k(S_k) \gamma_k(S_{k-1}, S_k). \quad (6)$$

If an initial state and an end state are assumed as state 0, respectively, terminal conditions are as follows:

$$\alpha_0(S_0) = \begin{cases} 1, & \text{if } S_0 = 0 \\ 0, & \text{if } S_0 \neq 0 \end{cases} \quad \beta_N(S_N) = \begin{cases} 1, & \text{if } S_N = 0 \\ 0, & \text{if } S_N \neq 0 \end{cases} \quad (7)$$

Using $\alpha$, $\beta$ and $\gamma$, a posteriori probability $\Lambda(x_k)$ is calculated from the following formula:

$$\Lambda(xk) = \ln \frac{\sum_{S1} \alpha_{k-1}(S_{k-1}) \gamma_k(S_{k-1}, S_k) \beta_k(S_k)}{\sum_{S0} \alpha_{k-1}(S_{k-1}) \gamma_k(S_{k-1}, S_k) \beta_k(S_k)}. \quad (8)$$

In the formulas, S1 signifies all state transitions associated with $x_k=1$ and S0 signifies all transition states associated with $x_k=0$. Finally, the a priori information $\Lambda a(x_k)$ is subtracted from the a posteriori probability $\Lambda(x_k)$ and extrinsic information $\Lambda e(x_k)$ is obtained as follows:

$$\Lambda_e(x_k) = \Lambda(x_k) - \Lambda_a(x_k) \quad (9).$$

Figure 9:
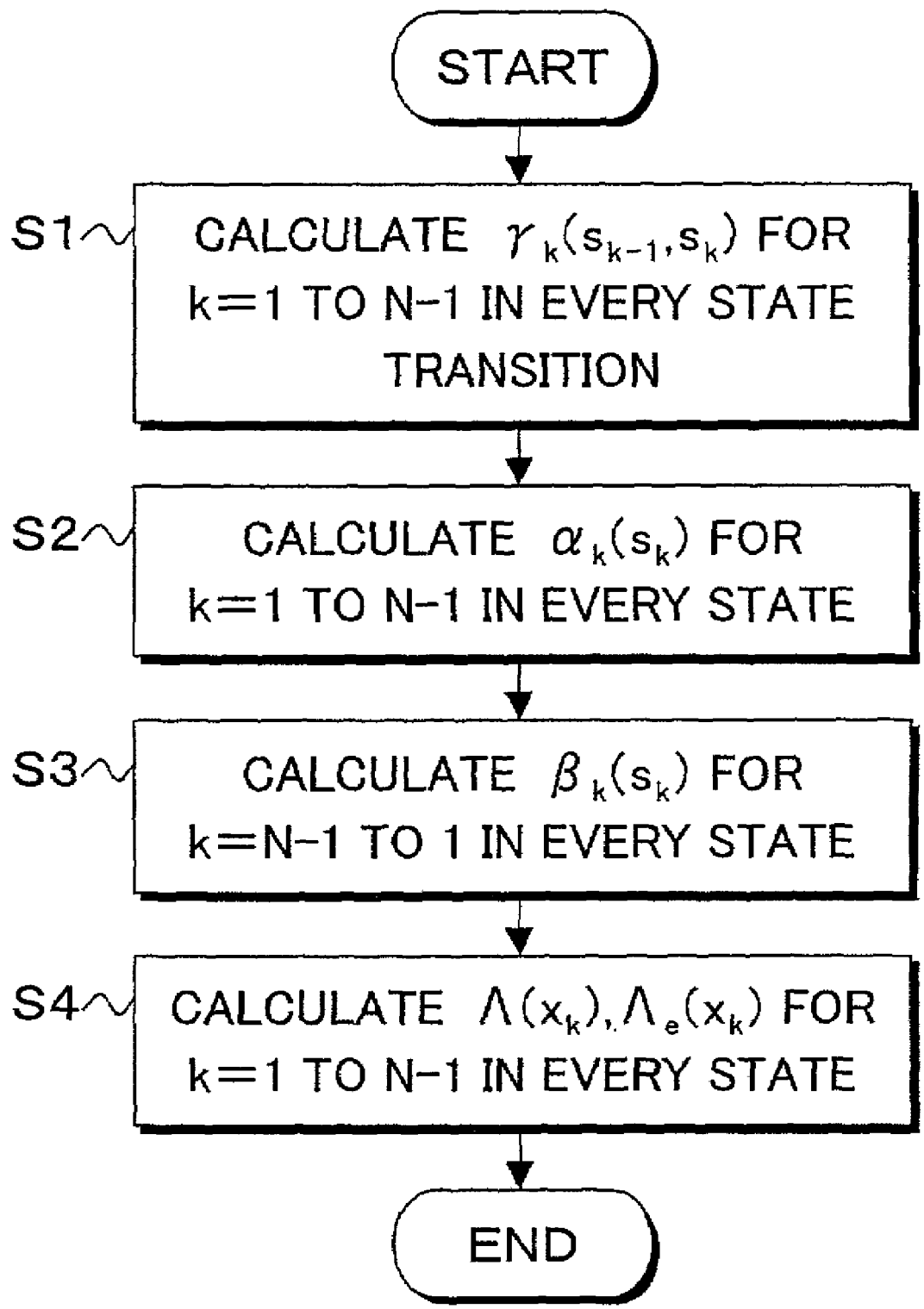
FIG. 9 is a flow chart showing a BCJR decoding method conducted by the decoder shown in FIG. 8B.

FIG. 9 is a flow chart showing calculation procedures in the inner decoder 84 shown in FIG. 8B. First, in a step S1, $\gamma_k(S_{k-1}, S_k)$ is calculated based on the formulas (3) and (4). Next, in a step S2, $\alpha_k(S_k)$ is obtained based on the formula (5) and in a step S3, $\beta_k(S_k)$ is obtained based on the formula (6). Finally, in a step S4, $\Lambda(x_k)$ and $\Lambda e(x_k)$ are obtained based on the formulas (8) and (9). On the other hand, with a view of reducing computational complexity in the inner decoder 84, there is proposed a LogMAP decoding method for calculating a BCJR algorithm in a log domain.

With the LogMAP decoding method, the formulas (4) to (8) are replaced by the following formulas (10) to (14), respectively but calculation procedures are the same:

$$\gamma_k(S_{k-1}, S_k) = x_k \Lambda_a(x_k) + \Lambda_c(y_k) \quad (10)$$

$$\alpha_k(S_k) = \max_{S_{k-1}} {}^* [\alpha_{k-1}(S_{k-1}) + \gamma_k(S_{k-1}, S_k)] \quad (11)$$

$$\beta_{k-1}(S_{k-1}) = \max_{S_{k-1}} {}^* [\beta_k(S_k) + \gamma_k(S_{k-1}, S_k)] \quad (12)$$

$$\alpha_0(S_0) = \begin{cases} 0, & \text{if } S_0 = 0 \\ -\infty, & \text{if } S_0 \neq 0 \end{cases} \quad \beta_N(S_N) = \begin{cases} 0, & \text{if } S_N = 0 \\ -\infty, & \text{if } S_N \neq 0 \end{cases} \quad (13)$$

$$\Lambda(x_k) = \max_{S1} {}^* [\alpha_{k-1}(S_{k-1}) + \gamma_k(S_{k-1}, S_k) + \beta_k(S_k)] - \max_{S0} {}^* [\alpha_{k-1}(S_{k-1}) + \gamma_k(S_{k-1}, S_k) + \beta_k(S_k)] \quad (14)$$

where $\max^*(a,b) = \max(a,b) + \ln\{1 + \exp(-|b-a|)\}$ (15)

Furthermore, there is proposed a Max-LogMAP decoding method for approximating the formula (15) to $$\max^*(a,b) = \max(a,b) \quad (16)$$

so as to further reduce calculation volume. In addition, an SOVA (Soft Output Viterbi Algorithm) for calculating the a posteriori probability in the course of conventional Viterbi decoding is disclosed by documents, "J. Hagenauer and P. Hoeher, "A viterbi algorithm with soft-decision outputs and its applications", IEEE GlobeCom, pp. 1680–86, 1989", and "M. C. Valent. "iterative detection and decoding for wireless communications." Ph.D. Dissertation. Virginia Tech., July 1999 <http://www.cs.wvu.edu/-mvalenti/pubs.html>" and the like.

A decoding method for correcting lost data according to the present invention is to replace the arithmetic operation in the formula (3) based on the BCJR decoding method by the following formula:

$$\Lambda_c(y_k) = \begin{cases} 0, & \text{if } e_k = \text{ON} \\ -\frac{1}{2\sigma^2}(y_k - m_k)^2, & \text{if } e_k = \text{OFF} \end{cases} \quad (17)$$

where $e_k$ is an erasure flag.

Namely, if the erasure flag $e_k$ is ON, the channel information $\Lambda c(y_k)$ is set at 0. If the erasure flag $e_k$ is OFF, the channel information $\Lambda c(y_k)$ is calculated as before.

Figure 10:
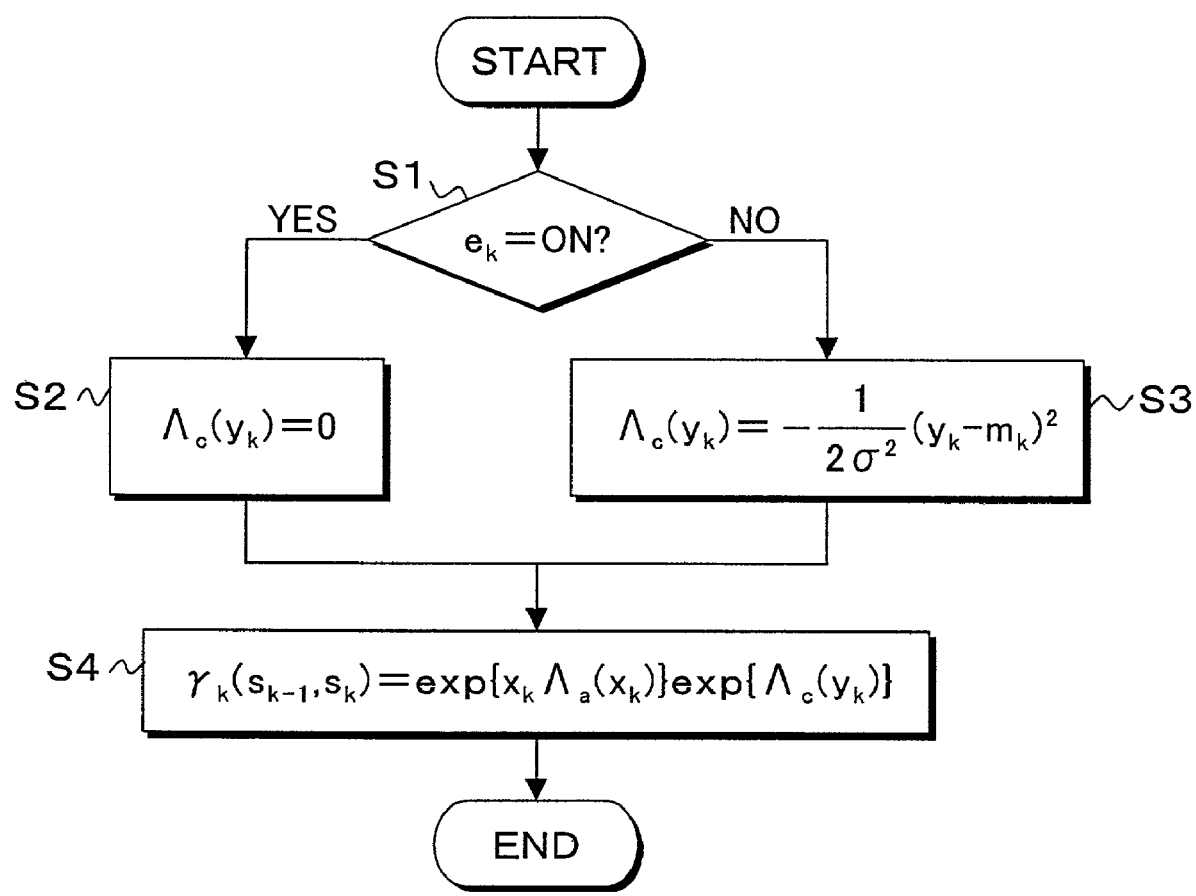
FIG. 10 is a flow chart of a path metric calculation method according to the present invention.

FIG. 10 is a flow chart showing calculating procedures for calculating the branch metric $\gamma_k(S_{k-1}, S_k)$ by the BCJR decoding method based on the present invention so as to correct the lost data. In a step S1, the erasure flag $e_k$ is checked. If the erasure flag $e_k$ is ON, channel information $\Lambda c(y_k)$ is set at 0 ($\Lambda c(y_k)$=0) in a step S2. If the erasure flag $e_k$ is OFF, channel information $\Lambda c(y_k)$ is calculated in a step S3. In a step S4, the branch metric $\gamma_k(S_{k-1}, S_k)$ is obtained.

If the channel information $\Lambda c(y_k)$ is 0 ($\Lambda_c(y_k)$=0), exp{$\Lambda c(y_k)$}=1. Accordingly, the second term of the formula (4) may be replaced as follows:

$$\exp\{\Lambda_c(y_k)\} = \begin{cases} 1, & \text{if } e_k = \text{ON} \\ \exp\left\{-\frac{1}{2\sigma^2}(y_k - m_k)^2\right\}, & \text{if } e_k = \text{OFF} \end{cases} \quad (18)$$

Checking the erasure flag $e_k$ and setting the channel information $\Lambda c(y_k)$ at 0 if the erasure flag $e_k$ is ON mean that the branch metric $\gamma_k(S_{k-1}, S_k)$ in the formula (4) is calculated using only the a prior information $\Lambda a(x_k)$ during the disappearance of the data. Both the LogMAP decoding method and the Max-LogMAP decoding method can employ the formula (17) in common. The same thing is true for the SOVA (Soft Output Algorithm). The SOVA method is an extended method of the Viterbi decoding method so as to produce soft output. The difference between the BCRJ decoding method and the SOVA decoding method is as follows. According to the BCRJ decoding 110 method, the a posteriori probability is obtained in light of all possible paths (state transition series). According to the SOVA decoding method, the a posteriori probability is obtained only from a part of paths. Due to this, although being inferior in performance to the BCJR decoding method, the SOVA decoding method is smaller in calculation volume. Although the SOVA decoding method differs in path selecting method from the BCJR decoding method, the both methods are basically the same SISO decoding methods. According to the SOVA decoding method, therefore, a branch metric for each state transition is calculated based on the formulas (3) and (4) or the formula (10) as in the case of the BCJR decoding method. The formula (17) according to the present invention can be applied to the SOVA decoding method as it is. By thus constituting the decoder, it is possible to accurately restore the lost bit from the other bit which is not lost.

The same idea can be also applied to the Turbo Decision Aided Equalization (DAE) method disclosed in the literature Z. Wu, "Coding and iterative detection for magnetic recording channels," Kluwer Academic Publishers, 2000. The TDAE is one of the methods of reducing an amount of calculations of the inner decoder (channel decoder), and the extrinsic information is calculated by following formula.

$$\Lambda_e(x_k) = \frac{2}{\sigma^2} \sum_{i=k}^{k+\mu} h_{i-k}\left(y_i - \sum_{j=0, j\neq i-k}^{\mu} h_j \hat{x}_{i-j}\right) \quad (19)$$

Where, $h_0, \ldots, h_\mu$: responses of the channels $$\hat{x}_k = \tanh\left(\frac{\Lambda_a(x_k)}{2}\right). \quad (20)$$

When the erasure flag is ON, by setting the inside of the parentheses of the right side of the formula (20) (or, $\Lambda_e(x_k)$ can be also set to 0), the erasure compensation can be performed in a manner similar to the case of the MaxLog-MAP method.

Figure 11:
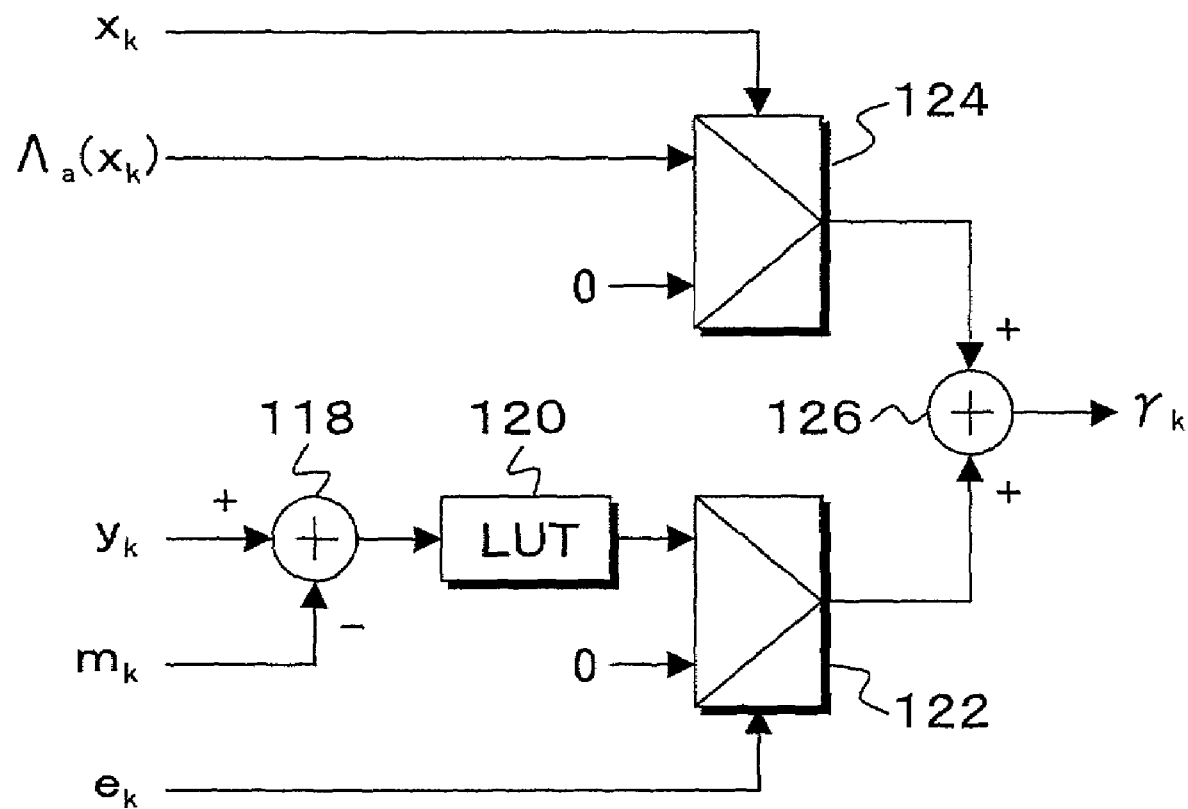
FIG. 11 is a block diagram of a branch metric calculating circuit according to the present invention.

FIG. 11 shows an example of a branch metric calculating circuit in the inner decoder 84 shown in FIG. 8B. A subtracter 118 obtains the difference between the signal $y_k$ and the ideal signal $m_k$. A lookup table (LUT) 120 obtains channel information $\Lambda c(x_k)$ from $\gamma_k$-$m_k$ based on the formula (3). A selector 122 selects either the output of the lookup table 120 or 0 in accordance with the erasure flag $e_k$. A selector 124 selects either the prior information $\Lambda a(x_k)$ or 0 in accordance with $x_k$. An adder 126 adds the output of the selector 122 and that of the selector 124 together, thereby outputting a branch metric $\gamma_k$. In FIG. 11, the erasure flag is simply referred to. As can be seen from FIGS. 2A to 2C and FIGS. 3A to 3C, the DC component of a read signal greatly changes just before the erasure flag changes from OFF to ON and right after the erasure flag changes from ON to OFF. Accordingly, it is possible to lessen the influence of the change of the DC component of the read signal by advancing the rising edge of the erasure flag or holding the rising edge thereof for a certain period of time. The advancement of the rising edge can be realized by buffering and relatively delaying the read signal.

Figure 12A:
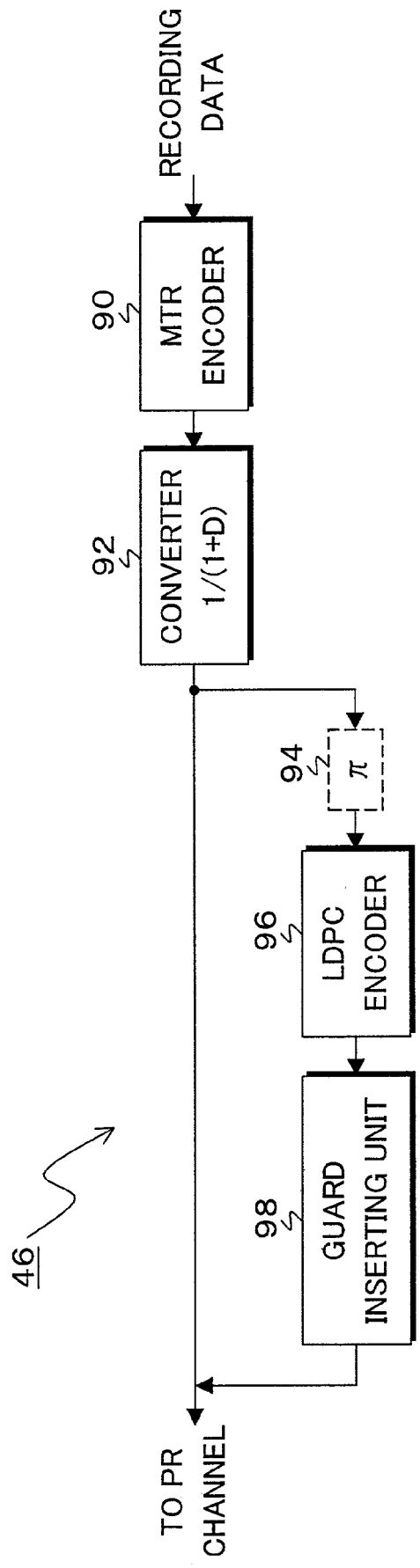
FIGS. 12A and 12B are block diagrams showing the concrete embodiments of the encoder and decoder according to the present invention employing a LDPC code.
Figure 12B:
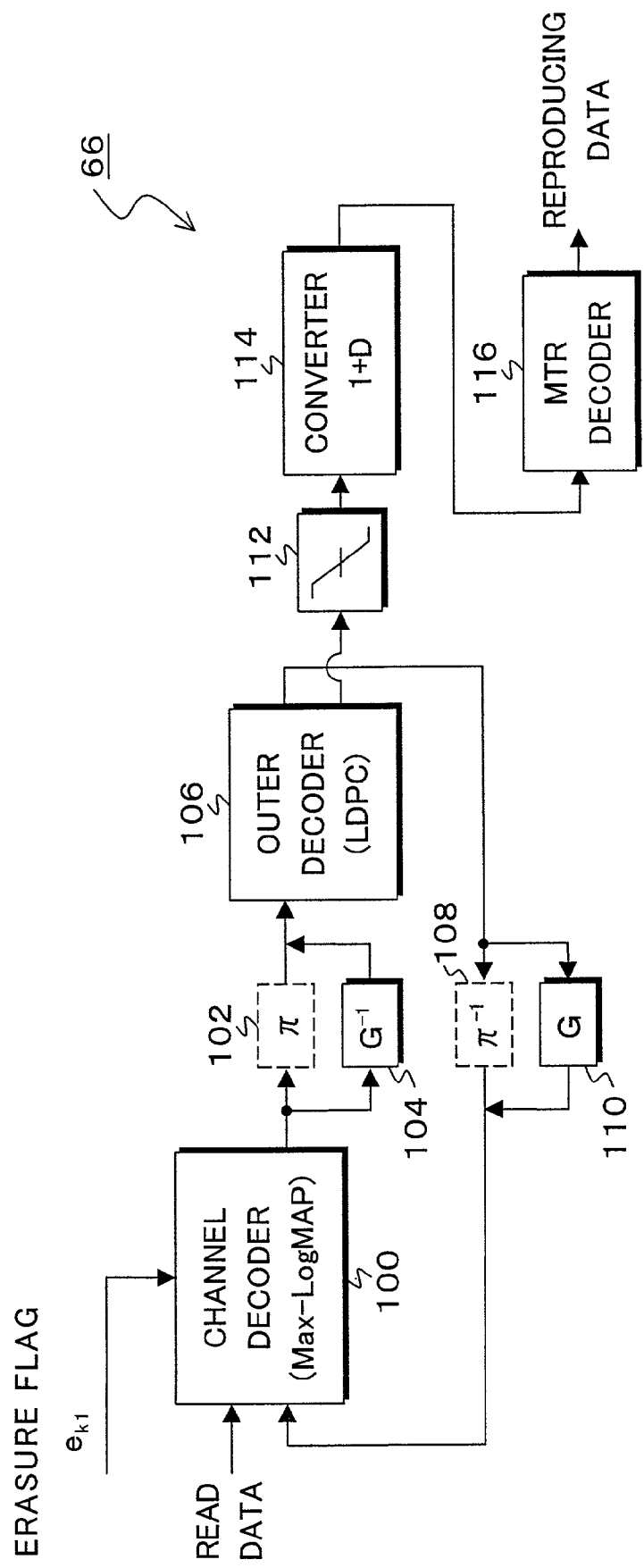

FIGS. 12A and 12B show the concrete examples of the encoder and the decoder, respectively if an LDPC code is employed as an outer code. FIG. 12A shows the concrete example of the encoder 46 shown in FIGS. 7A and 7B. The encoder 46 is constituted out of an MTR encoder 92 and an LDPC encoder 96. Recording data is encoded first by the MTR encoder 90 and the encoded data is subjected to 1/(1+D) conversion by a converter 92. Next, the resultant data is passed through a random interleaver 94 and then generated into parity bits by the LDPC encoder 96. Since an MTR (Maximum Transition Run) constraint is not satisfied by the parity bits, 0 is regularly inserted into the parity train by a guard inserter 98. Alternatively, 1 instead of 0 maybe inserted thereinto to satisfy only an RLL constraint. A guard insertion result is added to the output of the converter 92 and recorded on the PR channel. The inner encoder is not specially provided since the PR channel is utilized as the inner encoder. The overall encoder shown in FIG. 12A, therefore, functions as an outer encoder. Also, in FIG. 8A, the random interleaver 76 is provided after the outer encoder 74. In this embodiment, the random interleaver 94 is installed into the outer encoder. The interleaver in this embodiment has not only the same advantage as that of the interleaver provided after the outer encoder 74 shown in FIG. 8A but also has an advantage in that the MTR constraint is not destroyed by the interleaver. It is noted that the random interleaver is often omitted since a parity check matrix employed in the LDPC encoder 90 has a random characteristic per se. The decoder 66 shown in FIG. 12B mainly consists of a channel decoder (inner decoder) 100 based on the Max-LogMAP method and an outer decoder 106 based on a belief propagation method for LDPC decoding. The erasure flag $e_k$ is inputted into the channel decoder 100 to perform an erasure correction based on the present invention. Among the output of the channel decoder 100, an information symbol part is passed through the random interleaver 102 denoted by $\pi$ and a parity part thereof is passed through a guard bit deleting section 104 denoted by $G^{-1}$ and inputted into the outer decoder 106. On the other hand, among the extrinsic information output of the outer decoder 106, an information symbol part thereof and a parity part thereof are returned to the channel decoder 100 by way of a deinterleaver 108 denoted by $\pi^{-1}$ and a guard inserter 110 denoted by G, respectively. After a predetermined number of times of iteration, the a posteriori probability outputted from the outer decoder 106 is converted into a signal of 0 or 1 by a threshold processing of a comparator 112, the converted signal is subjected to (1+D) conversion by a converter 114 and outputted as reproducing data by way of an MTR decoder 116. If the random interleaver 94 of the encoder 46 is omitted, the random interleaver 102 and the deinterleaver 108 of the decoder 66 are omitted, as well.

Figure 13:
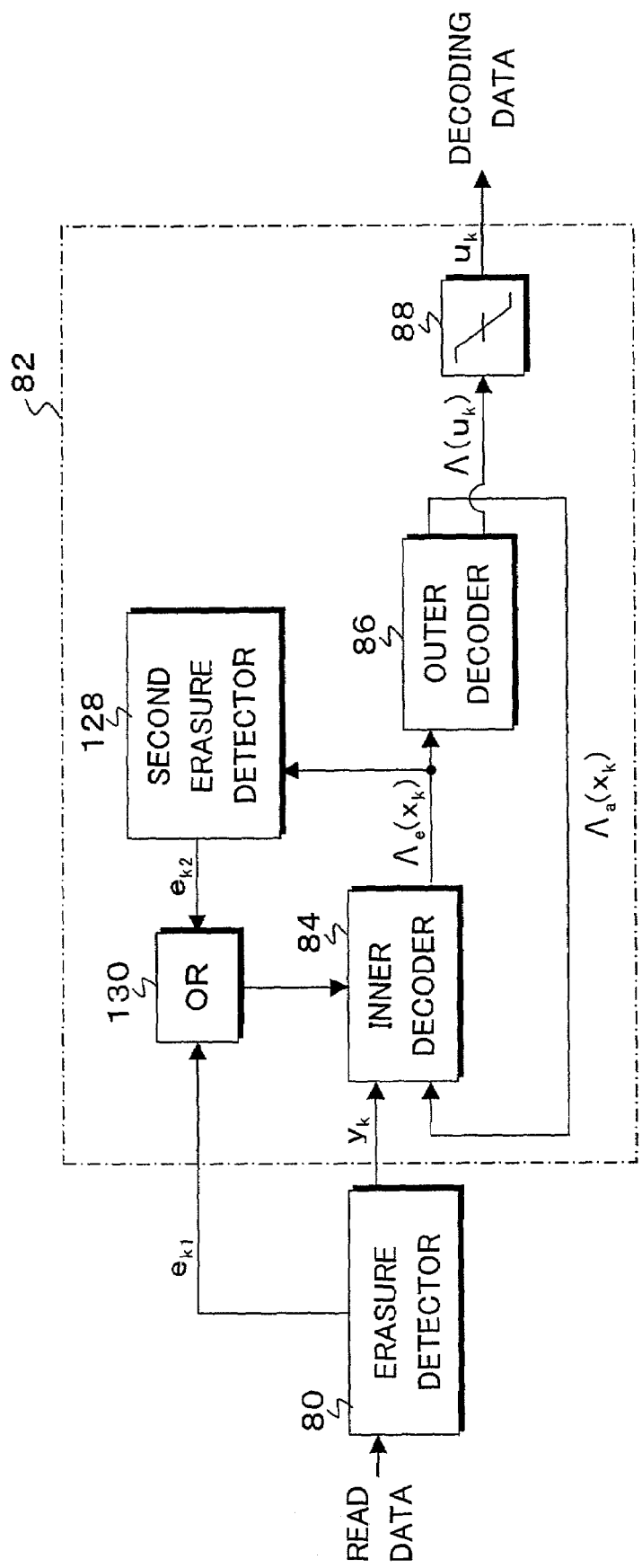
FIG. 13 is a block diagram showing the basic configuration of an iterative decoder according to the present invention which also compensates for data disappearance caused by a media defect.

FIG. 13 shows the basic configuration of an iterative decoder according to the present invention for compensating for data erasure derived from a TA phenomenon and a media defect. The first erasure detector 80 detecting data erasure derived from the TA phenomenon is provided in the input stage of the decoder 66 as in the case of FIG. 8B and the second erasure detector 128 is additionally provided in the iterative decoder 82. Further, the iterative decoder 82 is provided with the outer decoder 86 and the comparator 88 as in the case of FIG. 8B. The second erasure detector 128 checks whether the data satisfies the RLL constraint, i.e., an interval without magnetic transition has a length equal to or larger than a predetermined length by observing the output of the inner decoder 84. Then, the portion violating the RLL constraint, i.e., the portion in which the interval without magnetic transition has a length equal to or larger than the predetermined length is determined as a defect. A corresponding erasure flag is turned on and outputted as the second erasure flag $e_{k2}$. The second erasure flag $e_{k2}$ outputted from the second erasure detector 128 is ORed with the first erasure flag $e_{k1}$ outputted from the first erasure detector 80 and the result is inputted into the inner decoder 84. Now, the RLL constraint for which the second erasure detector 128 checks whether or not the data violates the RLL constraint will be described. A recording and reproducing apparatus performs recording so that the length of an interval without magnetic transition does not exceed a predetermined length with a view of stabilizing the clock recovery by the PLL. If magnetic transition does not occur over the predetermined length of interval, a read signal continues to be 0, with the result that the PLL does not normally operate. To prevent this, the recording and reproducing apparatus records a signal to include magnetic transition once at the intervals of, for example, 16 bits to thereby ensure the normal operation of the PLL. Actually, since user data is arbitrary, encoding referred to as RLL (Run Length Limited) encoding is performed, data is converted so as to satisfy the RLL constraint and then the resultant data is recorded on a medium.

Consequently, the length of the interval without magnetic transition is normally maintained to be equal to or lower than a certain value in the decoding result. However, if a defect occurs, a signal attenuates. Due to this, there is quite a high probability that the signal is decoded to a sequence without magnetic transition. Conversely, if a decoding result which does not satisfy the RLL constraint is obtained and the decoding result is regarded as a defect, it is possible to detect the defect with quite a high probability. According to the present invention, therefore, the recording and reproducing apparatus is constituted so that the second erasure detector 128 checks the violation of the RLL constraint to thereby detect a defect. The second erasure flag $e_{k2}$ outputted from the second erasure detector 128 is ORed with the first erasure flag $e_{k1}$ outputted from the first disappearance detector 80 by an OR circuit 130 and the result is inputted into the inner decoder 84. At this moment, the second erasure flag $e_{k2}$ is not defined until the inner decoder 84 completes with the first decoding. That is, in the first iteration, only the first erasure flag $e_{k1}$ is effective and the second erasure flag $e_{k2}$ is not effective until the second iteration. In addition, the second erasure detector 128 is operated only during the first iterative decoding. That is, the iterative decoder is constituted as follows. The second erasure detector 128 performs a detecting processing only after the inner decoder 84 performs the first decoding. When the inner decoder 84 performs the second and the following decoding processings, the second erasure detector 118 does not perform a detecting processing and maintains the erasure flag generated in the first decoding processing. The reason for constituting the iterative decoder as stated above is as follows. Once the outer decoder 86 performs decoding, it performs error correction, though partially, making it difficult to detect the violation of the RLL constraint derived from a defect.

Figure 14A:
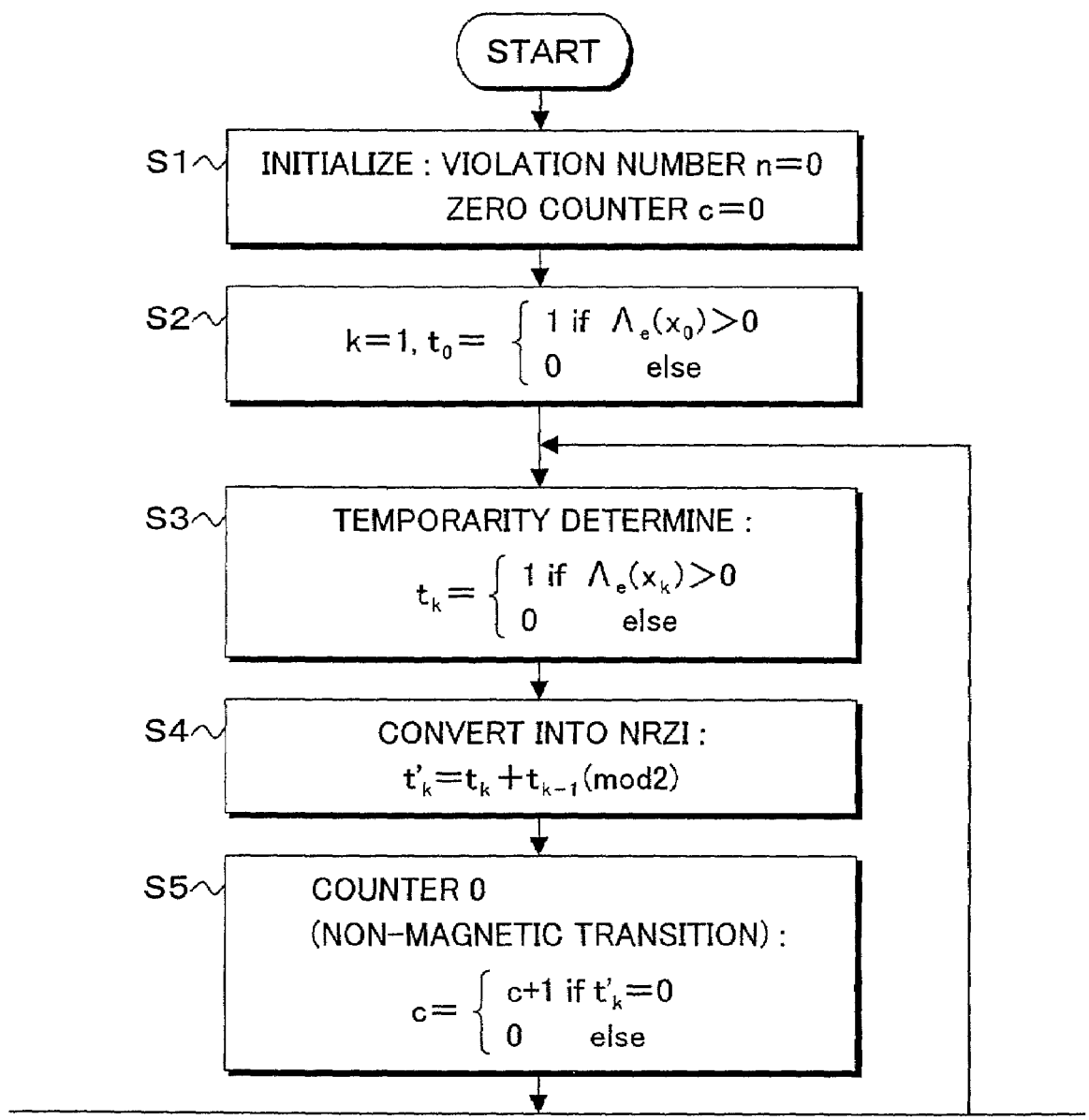
FIGS. 14A and 14B are flow charts of a defect detection in the iterative decoder shown in FIG. 13.
Figure 14B:
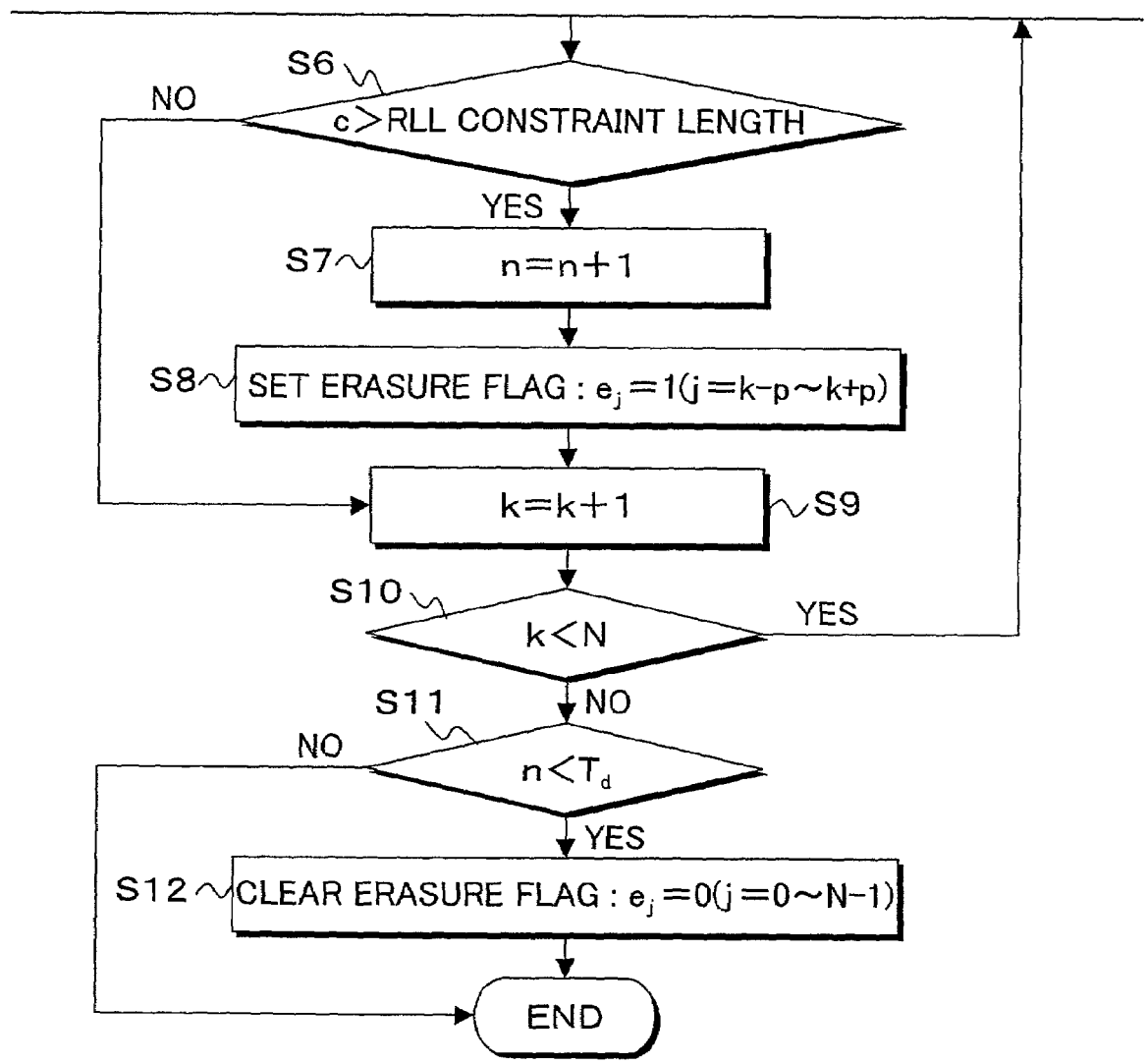

FIGS. 14A and 14B are flowcharts concretely showing the defect detection processing procedures of the second erasure detector 128. In FIGS. 14A and 14B, the length of a signal series is assumed as N (k=0 to N−1). It is also assumed that the output of the inner decoder is $\Lambda e(x_k)$. Symbol c is assumed as the continuous number of bits without magnetic transition (the continuous number of "0" when the code is expressed by NRZI), and symbol n is assumed as the number of times of the violation of the RLL constraints. First, in step S1, the number of times n of violation and the counter c are initialized to 0, respectively. Next, in step 2, k is set at 1 (k=1). Also, the output $\Lambda e(x_0)$ of the inner decoder is subjected to a threshold processing, thereby tentatively determining the $0^{th}$ bit of the code as follows:

$$t_0 = \begin{cases} 1 & \text{if } \Lambda e(xk) > 0 \\ 0 & \text{else} \end{cases} \tag{21}$$

Thereafter, in steps S3 to S10, the above-stated processings are repeated for each bit. First, in the step S3, the bit k are tentatively determined as:

$$t_k = \begin{cases} 1 & \text{if } \Lambda e(xk) > 0 \\ 0 & \text{else} \end{cases} \tag{22}$$

and then mod2 calculation is performed in the step S4, thereby converting the NRZ data into NRZI data:

$$t'k = t_k + t_{k-1} (\text{mod} 2) \tag{23}$$

In the formula (21), $t'_k=0$ indicates that there is no magnetic transition. Consequently, in a step S5, if $t'_k=0$, the counter c is incremented by 1 and otherwise, the counter c is set at 0 (c=0).

$$c = \begin{cases} c+1 & \text{if } t'_k = 0 \\ 0 & \text{else} \end{cases} \tag{24}$$

In a step S6, if the counter c exceeds the RLL constraint length, the bits k are determined to violate the RLL constraint. If so, the number of times n of violation is incremented by 1 in a step S7. Thereafter, in a step S8, the erasure flag is set at 1 in a range of ±p bits (where p is a preset constant) centered around the bits k. The above-stated processings are iterated while k satisfies k<N in a step S10 while incrementing the bits k by 1 in the step S7, thereby realizing desired defect detection processings. If the number of times n of violation is less than a threshold value Td in the last step, i.e., a step S11, a step S12 in which the erasure flag is cleared to zero may be provided for the following reason. If the number of times of violation is small, there is a possibility of erroneous detection. However, by performing the threshold processing, it is possible to suppress such erroneous detection. In addition, as for the interval in which the first erasure flag is on, c may be always set at 0 (c =0) in the formula (4) so that this second erasure detection is not carried out. The second erasure detector 128 also detects data erasure derived from the TA phenomenon. Due to this, when the TA phenomenon occurs, the number of times of violation easily exceeds the threshold value Td and the parts other than that having the TA phenomenon tend to be erroneously detected. In addition, if the value of p is selected to be high, the range of the TA phenomenon often, unnecessarily widens by ±p bits. This can be avoided if the defect detection is not performed in the interval in which the first erasure flag is on. As can be understood from the above, the second erasure detector 128 can detect the disappearance of read data derived from a media defect, eventually making it possible to accurately reproduce a recording data even if a defect occurs.

Figure 15A:
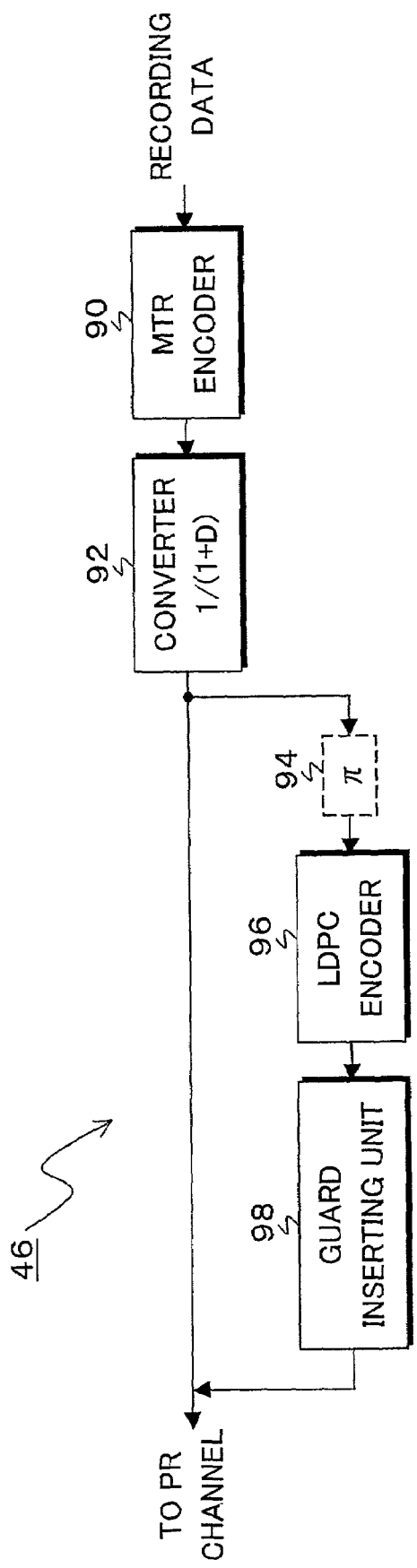
FIGS. 15A and 15B are block diagrams showing, together with an encoder, the concrete embodiment of the iterative decoder according to the present invention based on the basic configurations shown in FIG. 13.
Figure 15B:
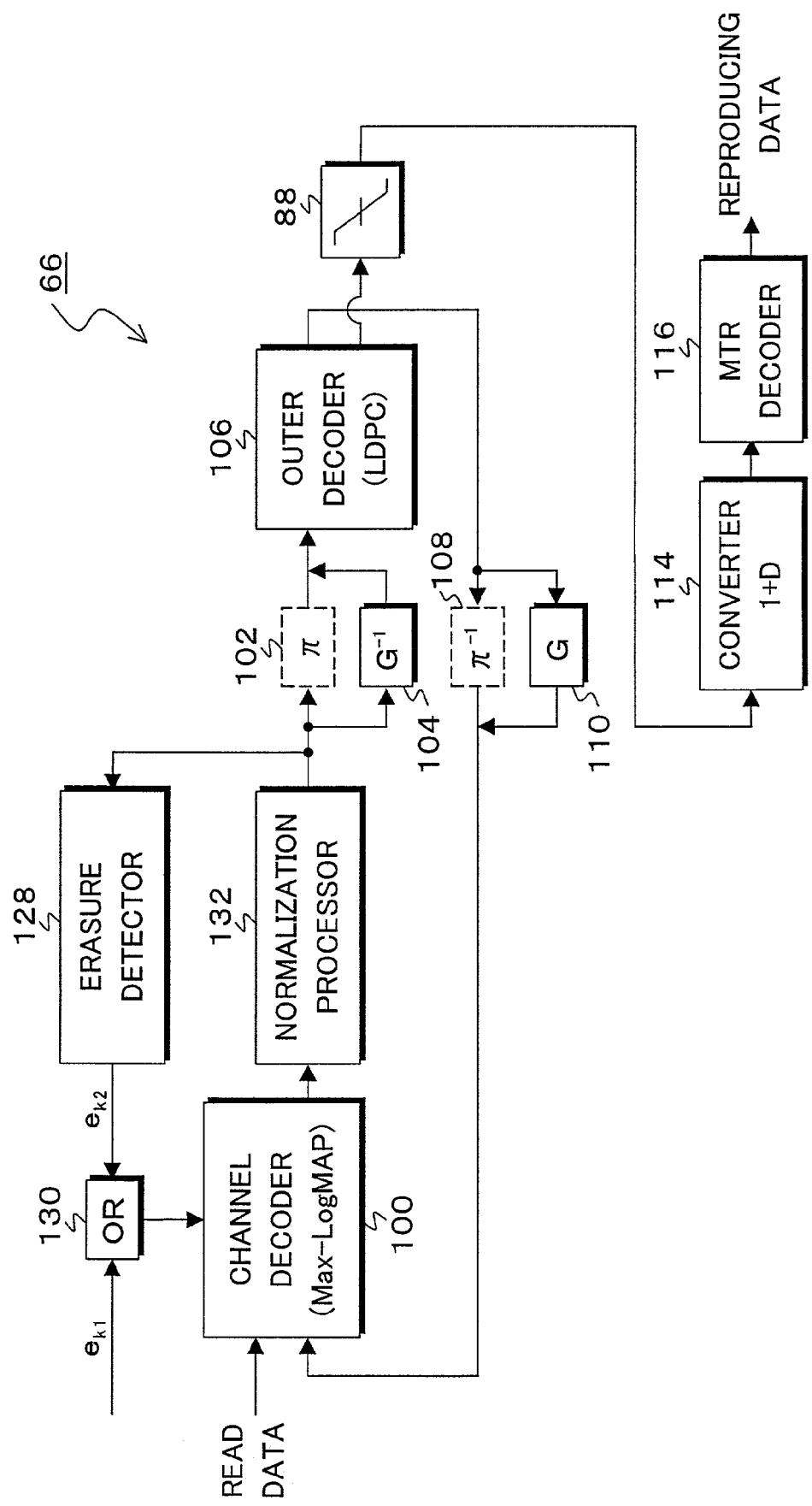

FIGS. 15A and 15B show the embodiment of the iterative decoder according to the present invention to which the basic configuration shown in FIG. 13 is applied. An encoder 46 shown in FIG. 15A is the same as the encoder 46 in the embodiment shown in FIG. 12A described above. In the encoder 46, an MTR encoder 90 performs RLL encoding so as to restrict the length of an interval without magnetic transition. A decoder 66 shown in FIG. 15B, on the other hand, is constituted so that the second erasure detector 128 is added to the decoder 66 shown in FIG. 12B. In the decoder 66, the second erasure flag $e_{k2}$ outputted from the second erasure detector 128 is ORed with the first erasure flag $e_{k1}$ outputted from the outside of the decoder 66 by an OR circuit 130 and the result is inputted into a channel decoder 100. By constituting the iterative decoder as stated above, even if a defect occurs, it is possible to accurately reproduce a recording data. It is noted that a normalization processing section 132 is added right after the channel decoder 100 in this embodiment. The normalization processing is to obtain the maximum value of the absolute value of the output $\Lambda_e(x_k)$ of the channel decoder 100 as shown below and to make the maximum value fall within a predetermined range A.

$$\Lambda_{max} = \mathrm{MAX}_{k}(|\Lambda_e(x_k)|) \quad (25)$$

$$\Lambda_e(x_k) = \frac{\Lambda_e(x_k) * A}{\Lambda_{max}} \quad (26)$$

$\Lambda_e(x_k)$ takes a higher value as an SN ratio is higher or the decoder 66 progresses iterative operation. If $\Lambda_e(x_k)$ is too high, the calculation of an outer decoder 106 may possibly overflow and the data cannot be normally decoded. This phenomenon is particularly conspicuous when a defect occurs. To compensate for such a phenomenon, the normalization processing section 132 is provided. The defect detection of the second erasure detector 128 is the same between a case where the normalization processing section 132 is provided to perform normalization processing and a case where no normalization processing is performed.

As stated so far, according to the present invention, it is possible for the iterative decoder to correct data which disappeared due to a TA phenomenon or the like and, therefore, possible to realize the ECC-less configuration. It is possible to record user data excessively by as much as the elimination of the parity of the ECC's and to eventually increase the recording capacity of a recording and reproducing apparatus. In addition, by reinforcing the parity of iterative codes instead of eliminating the parity of the ECC's, it is possible to enhance an error correction capability. Furthermore, it is possible for the iterative decoder to accurately decode the read data which disappeared due to a TA phenomenon or a media defect.

It is noted that the present invention contains appropriate changes and modifications which do not hamper the object and advantages of the invention and that the present invention is not limited to any numeric values shown in the above-stated embodiments.

What is claimed is:

1. A recording and reproducing apparatus comprising:
   an erasure detector generating an erasure flag indicating disappearance of a read signal; and
   an iterative decoder having two soft-in/soft-out decoders, the two soft-in/soft-out decoders being an inner decoder and an outer decoder, the iterative decoder acting upon the disappearance of the read signal by inputting said erasure flag into the inner decoder and performing erasure compensation in the inner decoder.

2. The apparatus according to claim 1, wherein
   as the erasure compensation in said inner decoder, channel information is masked while said erasure flag is on.

3. The apparatus according to claim 1, wherein
   said erasure detector detects thermal asperity and generates the erasure flag indicating the disappearance of the read signal.

4. The apparatus according to claim 1, wherein
   said soft-in/soft-out inner decoder is configured for operating a BCJR (Bahl-Cocke-Jeinek-Raviv) decoding algorithm; and if said erasure flag is on, channel information is masked with 0 in the inner decoder.

5. The apparatus according to claim 1, wherein
   said soft-in/soft-out inner decoder is configured for operating a BCJR (Bahl-Cocke-Jeinek-Raviv) decoding algorithm; and if said erasure flag is on, an exponential value of channel information is masked with 1 in the inner decoder.

6. The apparatus according to claim 1, wherein
   said soft-in/soft-out inner decoder is configured for operating a logarithm maximum a posteriori probability (LogMAP) decoding algorithm; and if said erasure flag is on, channel information is masked with 0 in the inner decoder.

7. The apparatus according to claim 1, wherein
   said soft-in/soft-out inner decoder is configured for operating an approximation type logarithm maximum a posteriori probability (MaxLogMAP) decoding algorithm; and if said erasure flag is on, channel information is masked with 0 in the inner decoder.

8. The apparatus according to claim 1, wherein
   said soft-in/soft-out inner decoder is configured for operating a soft output Viterbi algorithm (SOVA) decoding algorithm; and if said erasure flag is on, channel information is masked with 0 in the inner decoder.

9. The apparatus according to claim 1, wherein
   said erasure detector expands forward a leading edge of the erasure flag by a predetermined number of bits.

10. The apparatus according to claim 1, wherein
    said erasure detector expands backward a trailing edge of the erasure flag by a predetermined number of bits.

11. The apparatus according to claim 1, further comprising:
a second erasure detector provided in said iterative decoder, said second erasure detector generating a second erasure flag indicating the disappearance of the read signal; wherein a logical sum of the first erasure flag and the second erasure flag by said second erasure detector is inputted into the inner decoder.

12. The apparatus according to claim 11, wherein said second erasure detector generates the second erasure flag by checking violation of an RLL constraint.

13. The apparatus according to claim 12, wherein said second erasure detector generates the second erasure flag only if a number of times of the violation of the RLL constraint is equal to or higher than a predetermined number.

14. A signal decoding circuit comprising:
an erasure detector generating an erasure flag indicating disappearance of a read signal; and
an iterative decoder having two soft-in/soft-out decoders, the two soft-in/soft-out decoders being an inner decoder and an outer decoder, the iterative decoder acting upon the disappearance of the read signal by inputting said erasure flag into the inner decoder and performing erasure compensation in the inner decoder.

15. The signal decoding circuit according to claim 14, wherein
as the erasure compensation in said inner decoder, channel information is masked while said erasure flag is on.

16. The signal decoding circuit according to claim 14, wherein
said erasure detector detects thermal asperity and generates the erasure flag indicating the disappearance of the read signal.

17. The signal decoding circuit according to claim 14, wherein
said soft-in/soft-out inner decoder is configured for operating a BCJR (Bahl-Cocke-Jeinek-Raviv) decoding algorithm; and if said erasure flag is on, channel information is masked with 0 in the inner decoder.

18. The signal decoding circuit according to claim 14, wherein
said soft-in/soft-out inner decoder is configured for operating a BCJR (Bahl-Cocke-Jeinek-Raviv) decoding algorithm; and if said erasure flag is on, an exponential value of channel information is masked with 1 in the inner decoder.

19. The signal decoding circuit according to claim 14, wherein
said soft-in/soft-out inner decoder is configured for operating a logarithm maximum a posteriori probability (LogMAP) decoding algorithm; and if said erasure flag is on, channel information is masked with 0 in the inner decoder.

20. The signal decoding circuit according to claim 14, wherein
said soft-in/soft-out inner decoder is configured for operating an approximation type logarithm maximum a posteriori probability (MaxLogMAP) decoding algorithm; and if said erasure flag is on, channel information is masked with 0 in the inner decoder.

21. The signal decoding circuit according to claim 14, wherein
said soft-in/soft-out inner decoder is configured for operating a soft output Viterbi algorithm (SOVA) decoding algorithm; and if said erasure flag is on, channel information is masked with 0 in the inner decoder.

22. The signal decoding circuit according to claim 14, wherein
said erasure detector expands forward a leading edge of the erasure flag by a predetermined number of bits.

23. The signal decoding circuit according to claim 14, wherein
said erasure detector expands backward a trailing edge of the erasure flag by a predetermined number of bits.

24. The signal decoding circuit according to claim 14, further comprising:
a second erasure detector provided in said iterative decoder, said second erasure detector generating a second erasure flag indicating the disappearance of the read signal; wherein a logical sum of the first erasure flag and the second erasure flag by said second erasure detector is inputted into the inner decoder.

25. The signal decoding circuit according to claim 24, wherein
said second erasure detector generates the second erasure flag by checking violation of an RLL constraint.

26. The signal decoding circuit according to claim 25, wherein
said second erasure detector generates the second erasure flag only if a number of times of the violation of the RLL constraint is equal to or higher than a predetermined number.

27. An error correction method for decoding a read signal by an iterative decoder comprising two soft-in/soft-out decoders, the two soft-in/soft-out decoders being an inner decoder and an outer decoder, the method comprising the steps of:
generating an erasure flag indicating disappearance of said read signal; and
inputting said erasure flag into said inner decoder, performing erasure compensation in the inner decoder, and thereby correcting the disappearance.

28. The method according to claim 27, further comprising the steps of:
detecting a second erasure flag indicating the disappearance of the read signal by a second erasure detector provided in said iterative decoder; and
inputting a logical sum of the first erasure flag and the second erasure flag by said second erasure detector into the inner decoder.

29. An iterative decoder comprising two soft-in/soft-out decoders, the two soft-in/soft-out decoders being an inner decoder and an outer decoder, said iterative decoder being configured for inputting an external erasure flag indicating disappearance of a read signal into the inner decoder, said inner decoder being configured for performing erasure compensation in the inner decoder, and thereby correcting lost data.

30. The iterative decoder according to claim 29, further comprising:
an erasure detector provided in said iterative decoder, said erasure detector being configured for generating an internal erasure flag indicating the disappearance of the read signal; said iterative decoder being further configured for inputting a logical sum of said external erasure flag and said internal erasure flag into the inner decoder.

* * * * *